US012641744B2

(12) United States Patent
Olesiewicz

(10) Patent No.: US 12,641,744 B2
(45) Date of Patent: May 26, 2026

(54) HIGH AIRFLOW STORAGE DEVICE ARRAY AND RELATED ELECTRONIC MODULES

(71) Applicant: QUALCOMM Incorporated, San Diego, CA (US)

(72) Inventor: Timothy Wayne Olesiewicz, Melbourne Beach, FL (US)

(73) Assignee: QUALCOMM Incorporated, San Diego, CA (US)

( * ) Notice: Subject to any disclaimer, the term of this patent is extended or adjusted under 35 U.S.C. 154(b) by 140 days.

(21) Appl. No.: 18/777,682

(22) Filed: Jul. 19, 2024

(65) Prior Publication Data

US 2024/0373579 A1 Nov. 7, 2024

Related U.S. Application Data

(62) Division of application No. 18/046,027, filed on Oct. 12, 2022, now Pat. No. 12,082,362.

(60) Provisional application No. 63/255,361, filed on Oct. 13, 2021.

(51) Int. Cl.
*H05K 7/14* (2006.01)
*H05K 9/00* (2006.01)

(52) U.S. Cl.
CPC ......... *H05K 7/1487* (2013.01); *H05K 7/1401* (2013.01); *H05K 7/1489* (2013.01); *H05K 9/0081* (2013.01)

(58) Field of Classification Search
CPC ...................................................... H05K 7/14
See application file for complete search history.

(56) References Cited

U.S. PATENT DOCUMENTS

| | | |
|---|---|---|
| 6,816,368 B2 | 11/2004 | Yokosawa |
| 7,034,220 B2 | 4/2006 | Kim et al. |
| 8,295,051 B2 | 10/2012 | Cheng |
| 8,331,088 B2 | 12/2012 | Miyamoto et al. |
| 8,574,046 B2 | 11/2013 | Nishiyama et al. |
| 8,773,861 B2 | 7/2014 | Ross et al. |
| 9,245,587 B2 | 1/2016 | Chen et al. |
| 9,578,786 B1 | 2/2017 | Beall et al. |

(Continued)

OTHER PUBLICATIONS

Invitation to Pay Additional Fees and Partial International Search for International Patent Application No. PCT/US2022/078018, mailed Jan. 27, 2023, 13 pages.

(Continued)

*Primary Examiner* — Jerry Wu
(74) *Attorney, Agent, or Firm* — W&T

(57) ABSTRACT

An electronic assembly for handling a storage module is provided. The electronic assembly includes an open frame structure having a front frame including a front opening configured to receive air, and two side rails coupled to opposite sides of the front frame. Each side rail includes a side opening and an extended portion. The side opening is configured to direct the air received by the front opening at least partially out of the open frame structure. The extended portion extends from the side opening and away from the front frame and is configured to hold a storage module. The electronic assembly includes a lever bar coupled in proximity to the opposite sides of the front frame and having a lock position that is configured to lock the storage module onto a chassis base and a release position that is configured to release the storage module from the chassis base.

10 Claims, 18 Drawing Sheets

(56) References Cited

U.S. PATENT DOCUMENTS

| 2007/0127202 | A1* | 6/2007 | Scicluna | ................. G06F 1/184 |
| 2007/0247804 | A1 | 10/2007 | Li et al. | |
| 2008/0175552 | A1 | 7/2008 | Smrha et al. | |
| 2012/0058670 | A1 | 3/2012 | Regnier et al. | |
| 2016/0128237 | A1* | 5/2016 | Szeremeta | ......... H05K 7/20181 |
| | | | | 312/236 |
| 2018/0032464 | A1 | 2/2018 | Frink et al. | |
| 2023/0116549 | A1 | 4/2023 | Olesiewicz | |

OTHER PUBLICATIONS

International Search Report and Written Opinion for International Patent Application No. PCT/US2022/078018, mailed Mar. 10, 2023, 19 pages.

* cited by examiner

ELECTRONIC SYSTEM 210

210

220

225

230

230

215

230

HIGH AIRFLOW STORAGE DEVICE ARRAY AND RELATED ELECTRONIC MODULES

PRIORITY APPLICATIONS

The present application is a division of and claims priority to U.S. patent application Ser. No. 18/046,027, filed Oct. 12, 2022 and entitled "HIGH AIRFLOW STORAGE DEVICE ARRAY AND RELATED ELECTRONIC MODULES," which is incorporated herein by reference in its entirety.

U.S. patent application Ser. No. 18/046,027 claims priority to U.S. Provisional Patent Application Ser. No. 63/255,361, filed Oct. 13, 2021 and entitled "High Airflow Storage Device Array," which is incorporated herein by reference in its entirety.

BACKGROUND

I. Field of the Disclosure

This application relates generally to storage device carriers, particularly to devices and systems for handling storage modules that are installed and removed from electronic devices/modules.

II. Background

Storage carriers, drive trays, or drive brackets that are used to hold storage modules within a server are typically restrictive to airflow. In particular, the storage modules held within servers can act as barrier that prevent or restrict air from moving through a server and cooling other components of the server. This restrictive airflow results in difficulties in cooling server systems that contain storage devices at the air inlet of the server. Additionally, storage devices are typically clustered close together or consume most of the server's inlet area, resulting in high air impedance. The high impedance and restriction to airflow through storage carriers at the inlet of the server decreases thermal performance of server systems.

As such, there is a need for systems and devices that can improve the airflow in server systems.

SUMMARY

Exemplary aspects disclosed herein include high airflow storage device arrays. To address the cooling challenges presented by the use of storage modules, it is desirable to have devices and systems that can integrate storage modules in a server system (or other computing device) without restricting the airflow of the server system. The systems and devices described herein include high airflow storage device arrays that are configured to redirect airflow to flow channels away from the storage module and into dedicated low impedance regions. In exemplary aspects, the flow channels are defined by space formed between adjacent barrier walls that form bay openings for disposition of storage modules in the device array. Also, as an example, the devices described herein include a plenum area behind a front section of the device that enables airflow to bypass large blockages created by storage modules as well as openings in the device that allow airflow to exit the side of the device in front of the blockages, thereby further bypassing the blockages created by storage modules. As an example, openings are provided in the barrier walls so that heat generated from storage modules can be drawn into the flow channels defined by the adjacent barrier walls and be drawn away from the storage modules. Openings may also be provided in the front sections of the storage modules to allow air to be drawn through such openings through or across the storage module to dissipate heat generated by the storage modules. Fans may be provided in the high airflow storage device arrays to draw air that flows from the front and/or from the sides of the barrier walls from the storage modules, away from the storage modules. The devices described herein further provide user interface features with minimal frontal cross-sectional areas, such as a lever or a hand grip, that allow users to easily remove the devices from a server system.

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description," one will understand how the aspects of various implementations are used to provide an electronic assembly for handling storage modules that include airflow bypass channels for improving the airflow in an electronic system. Specifically, the electronic assembly for handling storage modules is configured to direct the airflow from the electronic assembly downstream to other components of the electronic system. As the skilled artisan will appreciate upon reading the descriptions provided herein, the same airflow enhancement techniques can be extended to electronic modules other than storage modules.

In one exemplary aspect, an electronic system is provided. The electronic system comprises a chassis base comprising a plurality of divider walls defining a plurality of device bays and a plurality of airflow bypass channels between adjacent divider walls of the plurality of divider walls, each device bay comprising a bay opening, the plurality of device bays alternating with the plurality of airflow bypass channels. Each divider wall has a divider opening in proximity to the bay opening of an immediately adjacent device bay.

In some implementations, the chassis base has a plurality of divider walls defining a device bay and an airflow bypass channel. The device bay has a bay opening and is configured to receive, via the bay opening, the open frame structure holding the storage module. In some implementations, the open frame structure and storage module are mechanically supported by the plurality of divider walls of the chassis base. Each divider wall has a divider opening in proximity to the bay opening of the device bay, and the divider opening is configured to be aligned with the side opening of a corresponding side rail and to direct the air exiting the side opening to the respective airflow bypass channel that is configured to direct the air away from the bay opening of the device bay.

In other implementations, the open frame structure and the storage module form a first electronic module, and the electronic assembly further includes a second electronic module including a second open frame structure holding a second storage module. The second electronic module is mechanically supported by the plurality of divider walls of the chassis base and is disposed below the first electronic module within the same device bay of the chassis base. In some implementations, the open frame structure and the storage module form a first electronic module, the device bay includes a first device bay, and the plurality of divider walls defines a second device bay that extends in parallel with the first device bay. The electronic assembly further includes a second electronic module including a second open frame structure holding a second storage module. The second electronic module is mechanically supported in the second device bay by the plurality of divider walls of the chassis base. In some implementations, the device bay of the chassis base includes a back plate that opposes the bay opening and has an electronic connector. The electronic connector is configured to electrically couple to the storage module received via the bay opening of the device bay.

In another exemplary aspect, an electronic assembly is provided. The electronic assembly comprises an open frame structure comprising: a front frame including a front opening configured to receive air, and two side rails coupled to two opposite sides of the front frame, a side opening configured to direct the air received by the front opening at least partially out of the open frame structure. The electronic assembly also comprises a lever bar coupled in proximity to the two opposite sides of the front frame and having at least a lock position and a release position, wherein the electronic assembly is configured to lock a storage module onto a chassis base in the lock position and to release the storage module from the chassis base in the release position.

In some implementations, the electronic assembly includes an electromagnetic (EM) shielding sheet coupled to the two side rails and has a plurality of opening holes. The EM shielding sheet encloses a hollow space with the front frame and the two side rails and is configured to form a bypass gap with the storage module held by the extended portion of each side rail. In some implementations, air received by the front frame is configured to enter the hollow space, exit the hollow space via the plurality of opening holes of the EM shielding sheet, hit the storage module, flow in the bypass gap, and exit the bypass gap via the side opening of each side frame, thereby dissipating heat generated by the storage module out of the electronic assembly. In some implementations, the plurality of opening holes of the EM shielding sheet has a total hole area that exceeds a threshold portion of an area of the front opening of the front frame. In some implementations, the electronic assembly includes a plurality of EM spring finger shields extending from the EM shielding sheet and towards the front frame. The plurality of EM spring finger shields enclose the hollow space from a top side and a bottom side of the hollow space. In some implementations, the EM spring finger shields are stamped Beryllium-Copper (Be—Cu).

In yet other implementations, a first side of the two opposite sides of the front frame that is configured to support a storage module is coupled to a trigger mechanism that is configured to release a first end of the lever bar from the lock position, and a second end of the lever bar is pivoted in proximity to a second side of the two opposite sides of the front frame. The second end of the lever bar may be located outside the opening area of the frame and storage module so as to not be in the path of air flow into the storage module. In some implementations, the lever bar is coupled to a spring structure, such that in response to a user action on the trigger mechanism, the lever bar that is held at the lock position is configured to pivot around the second end and release the first end to be loosely retained by the trigger mechanism. In the release position, part of the lever bar stands out of the front opening of the front frame to facilitate handling of the electronic assembly. In some implementations, the lever bar has a cross section facing the front opening of the front frame, and the cross section of the lever bar has a cross sectional area that is less than a threshold portion (e.g., 20%) of an area of the front opening of the front frame.

Other implementations and advantages may be apparent to those skilled in the art in light of the descriptions and drawings in this specification.

BRIEF DESCRIPTION OF THE DRAWINGS

FIGS. 7A-1 and 7A-2 illustrate perspective side views of the lever bar in a closed and open position, respectively, in accordance with some implementations;

FIGS. 7B-1 and 7B-2 illustrate perspective top views of the lever bar in a closed and open position, respectively, in accordance with some implementations;

FIGS. 7C-1 and 7C-2 illustrate top cross-sectional views of the lever bar in a closed and open position, respectively, in accordance with some implementations.

Like reference numerals refer to corresponding parts throughout the drawings.

DETAILED DESCRIPTION

Figure 1:
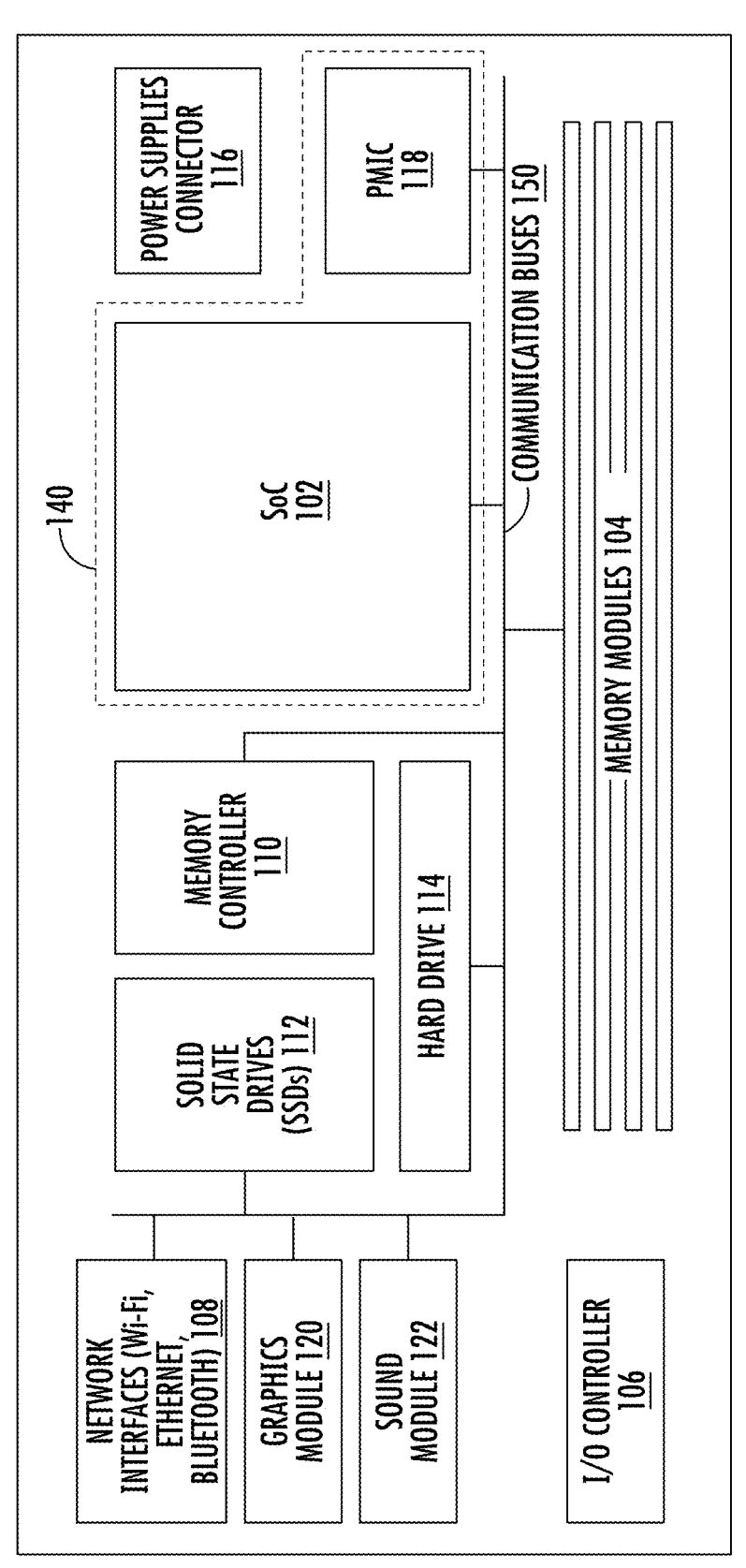
FIG. 1 is a block diagram of an example system module in a typical electronic device, in accordance with some implementations.

FIG. 1 is a block diagram of an example system module 100 in a typical electronic device, in accordance with some implementations. System module 100 in this electronic device includes at least a system on a chip (SoC) 102 having one or more processors, memory modules 104 for storing programs, instructions and data, an input/output (I/O) controller 106, one or more communication interfaces such as network interfaces 108, and one or more communication buses 150 for interconnecting these components. In some implementations, I/O controller 106 allows SoC 102 to communicate with an I/O device (e.g., a keyboard, a mouse or a touch screen) via a universal serial bus interface. In some implementations, network interfaces 108 includes one or more interfaces for Wi-Fi, Ethernet and Bluetooth networks, each allowing the electronic device to exchange data with an external source, e.g., a server or another electronic device. In some implementations, communication buses 150 include circuitry (sometimes called a chipset) that interconnects and controls communications among various system components included in system module 100.

In some implementations, memory modules 104 include high-speed random access memory, such as DRAM, SRAM, DDR RAM or other random access solid state memory devices. In some implementations, memory modules 104 include non-volatile memory, such as one or more magnetic disk storage devices, optical disk storage devices, flash memory devices, or other non-volatile solid-state storage devices. In some implementations, memory modules 104, or alternatively the non-volatile memory device(s) within memory modules 104, include a non-transitory computer readable storage medium. In some implementations, memory slots are reserved on system module 100 for receiving memory modules 104. Once inserted into the memory slots, memory modules 104 are integrated into system module 100.

In some implementations, system module 100 further includes one or more components selected from:

a memory controller 110 that controls communication between SoC 102 and memory components, including memory modules 104, in the electronic device;

solid-state drives (SSDs) 112 that apply integrated circuit assemblies to store data in the electronic device, and in many implementations, are based on NAND or NOR memory configurations;

a hard drive 114 that is a conventional data storage device used for storing and retrieving digital information based on electromechanical magnetic disks;

a power supply connector 116 that includes one or more direct current (DC) power supply interfaces each of which is configured to receive a distinct DC supply voltage;

power management integrated circuit (PMIC) 118 that modulates the distinct DC supply voltages received via the DC power supply interfaces to other desired internal supply voltages, e.g., 5V, 3.3V or 1.8V, as required by various components or circuits (e.g., processor cores in the SoC 102) within the electronic device;

a graphics module 120 that generates a feed of output images to one or more display devices according to their desirable image/video formats; and a sound module 122 that facilitates the input and output of audio signals to and from the electronic device under control of computer programs.

It is noted that communication buses 150 also interconnect and control communications among various system components including components 110-122.

In some implementations, additional non-transitory computer readable storage media can be added to the system module 100. For example, in some implementations, additional non-transitory computer readable storage media is added to the system module 100 as part of maintenance (e.g., additional backup, replacement of faulty non-transitory computer readable storage media, etc.), share information between devices, and/or to expand the current capabilities of the system module 100. In some implementations, non-transitory computer readable storage media can be removed from the system module 100. For example, in some implementations, non-transitory computer readable storage media is removed from the system module 100 to remove faulty non-transitory computer readable storage media, make unused non-transitory computer readable storage media available, and/or move non-transitory computer readable storage media from one system module 100 to another system module. In some implementations, the non-transitory computer readable storage media can be added and/or removed from the system module 100 using an electronic assembly described below in reference to FIGS. 2-9).

One skilled in the art knows that other non-transitory computer readable storage media can be used, as new data storage technologies are developed for storing information in the non-transitory computer readable storage media in the memory modules 104 and in SSDs 112. These new non-transitory computer readable storage media include, but are not limited to, those manufactured from biological materials, nanowires, carbon nanotubes and individual molecules, even though the respective data storage technologies are currently under development and yet to be commercialized.

In some implementations, SoC 102 is implemented in a semiconductor package including one or more integrated circuits, and each integrate circuit integrates a subset of: one or more microprocessor or CPU cores, memory, input/output ports and secondary storage on a single substrate. PMIC 118 is also implemented in a semiconductor package including one or more integrated circuits each of which is formed on a single substrate. SoC 102 is configured to receive one or more internal supply voltages (also called rail voltages) provided by PMIC 118 via one or more power rails. In some implementations, both SoC 102 and PMIC 118 are mounted on a main logic board, e.g., on two distinct areas of the main logic board, and electrically coupled to each other via conductive wires formed in the main logic board. This arrangement introduces parasitic effects and electrical noise that could compromise performance of the SoC, e.g., cause a voltage drop at an internal supply voltage. Alternatively, in accordance with various implementations described below, semiconductor dies of SoC 102 and PMIC 118 are vertically packaged in an integrated semiconductor device 140, such that they are electrically coupled to each other via electrical connections that are not formed in the main logic board. Such vertical arrangement of the semiconductor dies of SoC 102 and PMIC 118 reduces a length of electrical connections between SoC 102 and PMIC 118 and avoids performance degradation caused by routing conductive wires on the main logic board.

In some implementations, a generic PMIC 118 is configured to drive different types of SoC 102 in different types of electronic devices. Regardless of whether PMIC 118 and SoC 102 are arranged side by side or vertically, PMIC 118 occupies the same footprint with respect to the main circuit board, while SoC 102 may have a distinct footprint based on the electronic modules integrated therein. PMIC 118 includes a plurality of voltage regulator units that are arranged in a field programmable array. The plurality of voltage regulator units are identical to each other, or include more than one type of voltage regulator units. In a specific electronic device, control signals are determined based on rail voltages and rail currents of power rails required to power SOC 102 and other electronic modules, if any. For each of these power rails, a corresponding control signal is used to select a subset of voltage regulator units in the field programmable array of PMIC 118, and the selected voltage regulator units provide a rail current at a rail voltage to the respective power rail collectively. As such, PMIC 118 is reconfigured by these control signals to provide the rail voltages and currents to the power rails of SoC 102, and each voltage regulator unit in a plurality of configurable voltage regulators in PMIC 118 is either redundant or selected to drive one of the power rails by one of the control signals.

Figure 2:
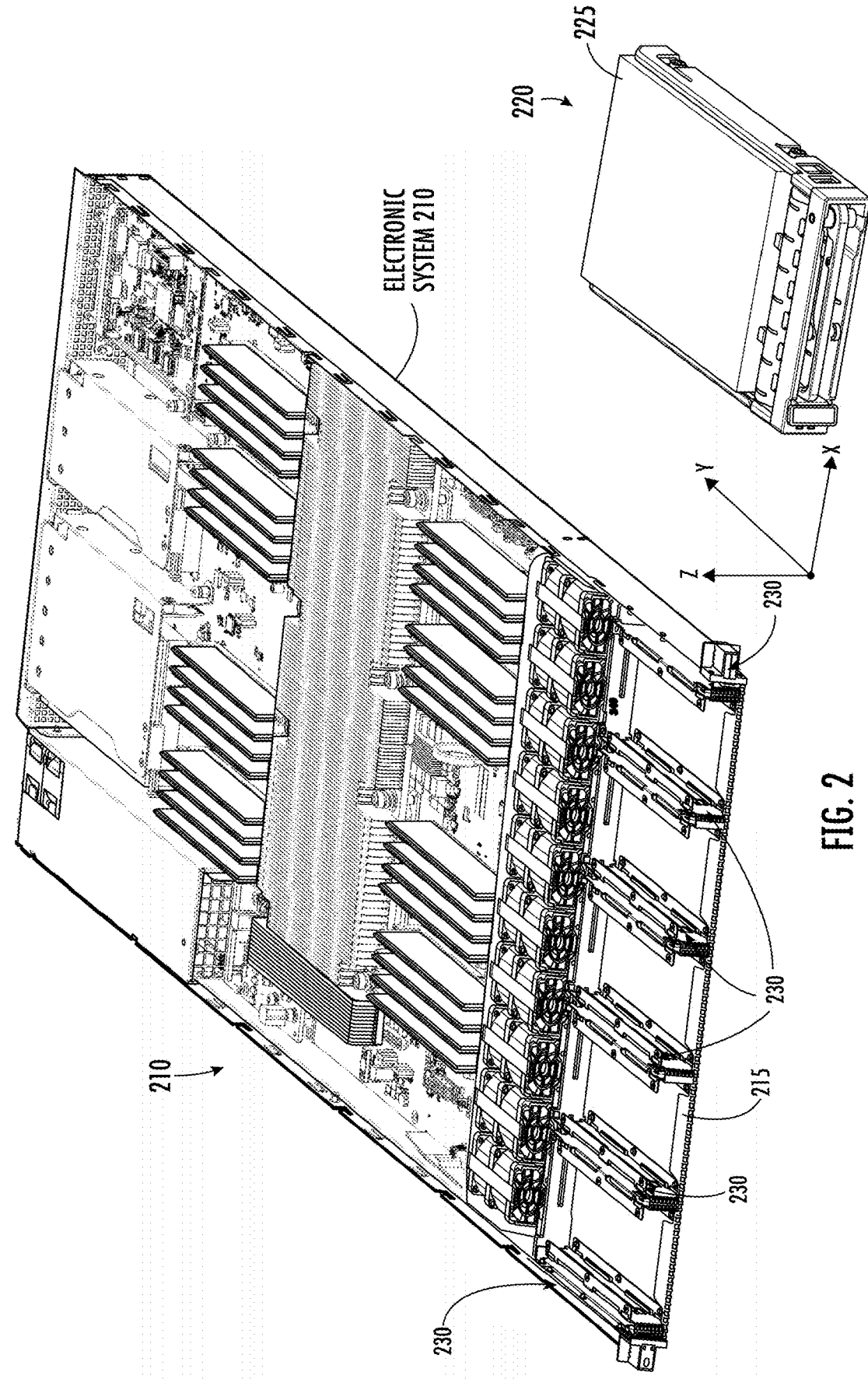
FIG. 2 is an overview of an electronic system including one or more electronic assemblies, in accordance with some implementations.

FIG. 2 is an overview 200 of an electronic system 210 including one or more electronic assemblies 220, in accordance with some implementations. In some implementations, the electronic system 210 further includes one or more components described above in reference to FIG. 1. For example, the electronic system 210 can include one or more of a SoC 102 (or a central processing unit (CPU), memory modules 104, an input/output (I/O) controller 106, network interfaces 108, communication buses 150, SSDs 112, and/or hard drives 114 as described above in reference to FIG. 1. In some implementations, one or more electronic modules 225 are added to and/or removed from the electronic system 210 via disposition in an electronic assembly 220, as described below.

In some implementations, the electronic system 210 is a server. The electronic system 210 is configured to receive one or more electronic assemblies 220 (as shown by an electronic assembly array 215). In some implementations, the electronic system 210 defines a plurality of device bays in which the one or more electronic assemblies 220 are received, as shown and described below in FIG. 3. In some implementations, the electronic system 210 further defines a plurality of airflow bypass channels 230 for cooling the one or more components of the electronic system 210, as described below in reference to FIGS. 3-4D.

The electronic assembly 220 is a carrier device configured to be coupled to one or more electronic modules 225. The one or more electronic modules 225 can be one or more non-transitory computer readable storage media, such as in SSDs 112, hard drives 114, or other non-transitory computer readable storage media described above in reference to FIG. 1. In some implementations, the one or more electronic modules 225 can be any hot swappable device (e.g., hardware that can be safely connected and disconnected while an electronic device is powered on and running). The electronic assembly 220 is configured to allow for the one or more electronic modules 225 to be easily and quickly installed or removed from the electronic system 210 as described below.

Figure 3A:
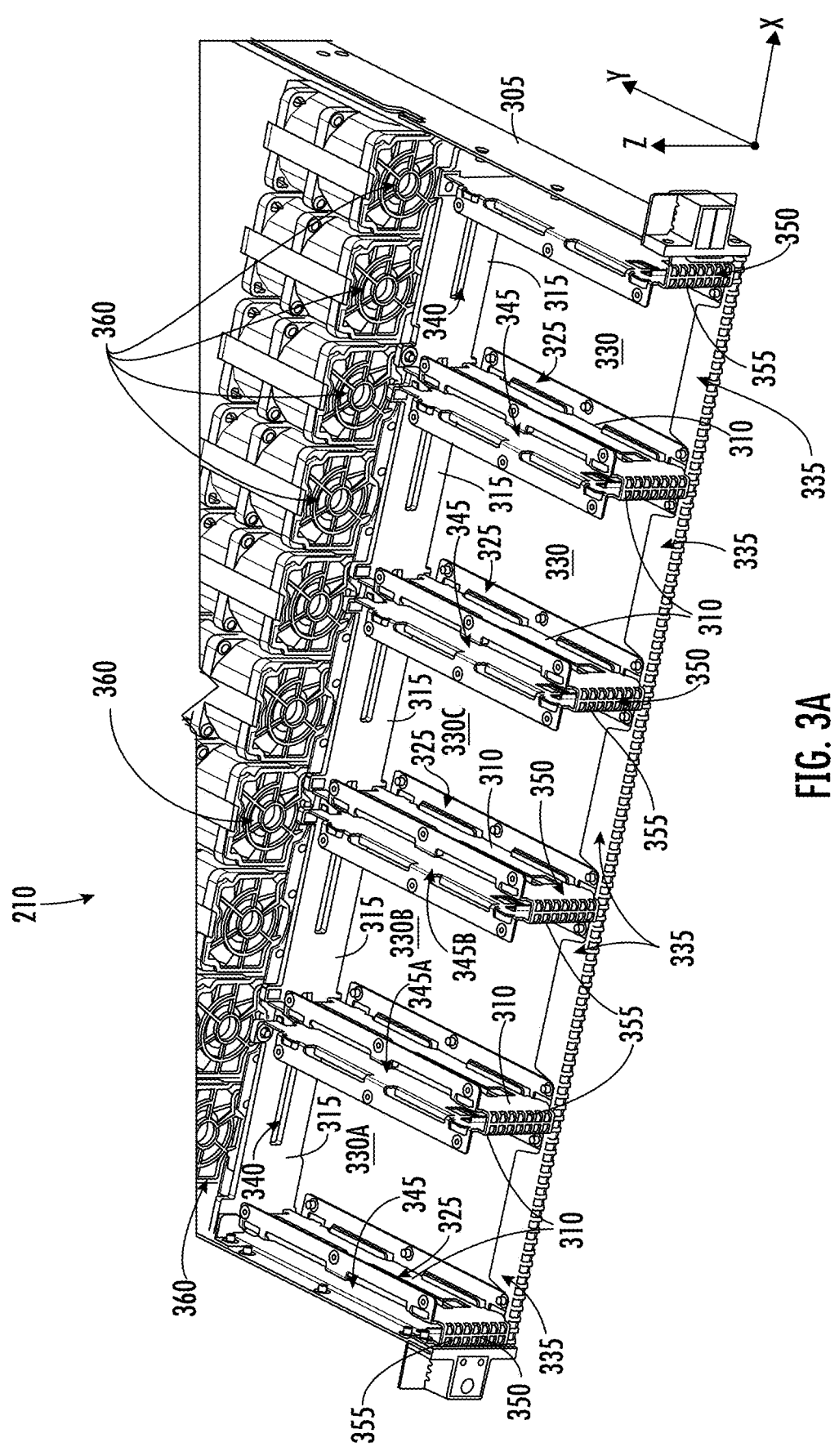
FIG. 3A illustrates a perspective side view of a chassis of an electronic system, in accordance with some implementations.
Figure 3B:
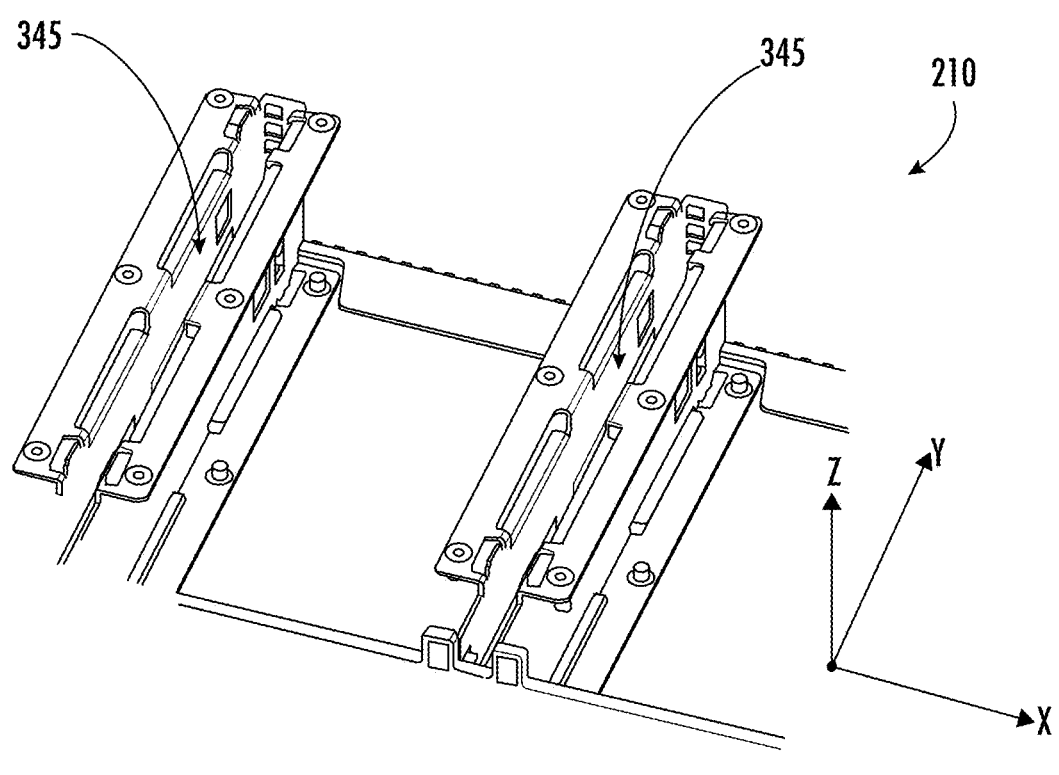
FIGS. 3B and 3C illustrate side perspective and top views, respectively, of the arrangement of coupling of the divider walls to the back plate.
Figure 3C:
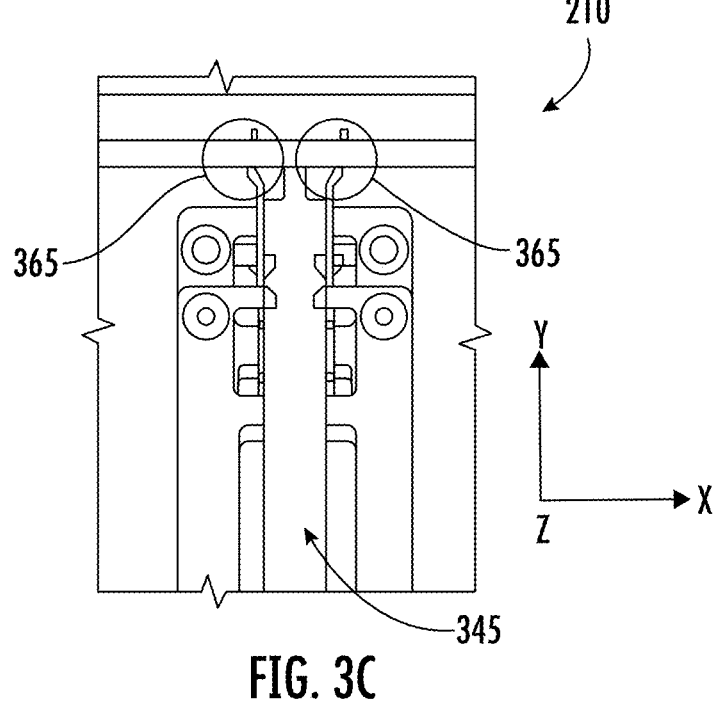

FIGS. 3A-3C illustrate a chassis of an electronic system 210 (FIG. 2), in accordance with some implementations. In some implementations, a chassis base 305 of the electronic system 210 has a plurality of divider walls 310 and a plurality of airflow bypass channels 345. The plurality of divider walls 310 define a plurality of device bays 330. In some implementations, the plurality of divider walls 310 are sheet metal. The plurality of divider walls 310 are coupled (e.g., riveted) to the chassis base 305 and a cover (not shown) of the electronic system 210. In this example, the chassis base 305 includes intake sections 350 that each include a plurality of front openings 355 coupled to the airflow bypass channels 345. In this manner, fans 360 in the electronic system 210 can pull air through the front openings 355 and into the airflow bypass channels 345 to draw such air towards the fans 360 away from the device bays 330 to dissipate heat generated by electronic modules 225 in the device bays 330. Also, as discussed in more detail below, the divider walls 310 also have openings that allow air from the device bays 330 to be drawn into the airflow bypass channels 345 to draw such air towards the fans 360 away from the device bays 330 to dissipate heat generated by electronic modules 225 in the device bays 330.

In some implementations, each device bay 330 of the plurality of device bays 330 includes a bay opening 335. For example, a first device bay 330-A includes a first bay opening 335 and a second device bay 330 includes a second bay opening 335. In some implementations, the plurality of device bays 330 include at least five device bays 330. The electronic system 210 is configured to receive, via the bay opening 335, one or more electronic modules that are mechanically supported by the plurality of divider walls 310. In particular, the electronic system 210 is configured to receive one or more electronic assemblies 220 that include one or more electronic modules (e.g., electronic assemblies 220 and electronic modules 225, as shown in FIG. 2). In some implementations, each device bay of the plurality of device bays 330 is configured to accommodate one or more electronic modules that are arranged on top of one another within the respective device bay. For example, as shown above in FIG. 2, at least two electronic assemblies 220 are received by each device bay (as shown by the electronic assembly array 215), the electronic assemblies 220 in each device bay are arranged on top of one another, and each electronic assembly 220 includes one or more electronic modules 225. In some implementations, each device bay of the plurality of device bays 330 extends in parallel with one another.

As described in detail below, the electronic assembly 220 is an open frame structure that is received by the chassis base 305 of the electronic system 210.

Each device bay 330 of the plurality of device bays 330 of the chassis base 305 includes a back plate 315 that opposes the bay opening 335 and has one or more openings 340 that are each configured to receive electrical connectors. The back plate 315 is positioned outside of respective airflow bypass channels of the plurality of airflow bypass channel 345 and eliminates an airflow chokepoint. One or more electronic connectors are configured to be disposed through the respective openings 340 to electrically couple to the one or more electronic assemblies 220 (i.e., the electronic modules) received via the bay opening 335 of the respective device bay 330. In some implementations, each device bay 300 includes at least two electronic connectors. For example, if the plurality of device bays 330 includes at least five device bays 330, the plurality of device bays 330 accommodates at least ten electronic modules 225 (e.g., two electronic modules 225 per device bay 330).

The plurality of device bays 330 alternate with the plurality of airflow bypass channels 345. For example, a first airflow bypass channel 345A is disposed between the first device bay 330A and the second device bay 330B, and a second airflow bypass channel 345B is disposed between the second device bay 330B and a third device bay 330C. Each divider wall 310 of the plurality of divider walls 310 has a divider opening 325 in proximity to the bay opening 335 of an immediately adjacent device bay 330. The divider walls 310 may be riveted to the chassis base 305 as a non-limiting example. The divider opening 325 is configured to direct air received from the bay opening 335 of the immediately adjacent device bay 330 to a respective airflow bypass channel 345 of the plurality of airflow bypass channel 345 that is configured to direct the air away from the bay opening 335 of the immediately adjacent device bay 330. For example, each divider wall 310 adjacent to the first bay opening 335A includes at least one respective divider opening 325 such that the air entering the first bay opening 335A is directed to a respective airflow bypass channel 345 of the plurality of airflow bypass channels 345. In some implementations, each divider wall 310 of the plurality of divider walls 310 has at least one divider opening 325 in proximity to the bay opening 335 of an immediately adjacent device bay 330 for each electronic module 225 it is configured to support. For example, if the first bay opening 335A is configured to support at least two electronic modules 225, each divider wall 310 adjacent to the first bay opening 335A includes at least two divider openings 325 (e.g., respective opening for each electronic module). Additional information on the airflow as it moves through electronic system 210 is shown and described below in reference to FIGS. 4A-4D.

Also, as shown in FIG. 3C, the divider walls 310 include protruding sections 365 that are coupled to the back plate 315 and outside of the air bypass channel 345. This serves to not impede the area of the air bypass channels 345 so as to not create a choke point to restrict air flow in the air bypass channels 345.

Figure 4A:
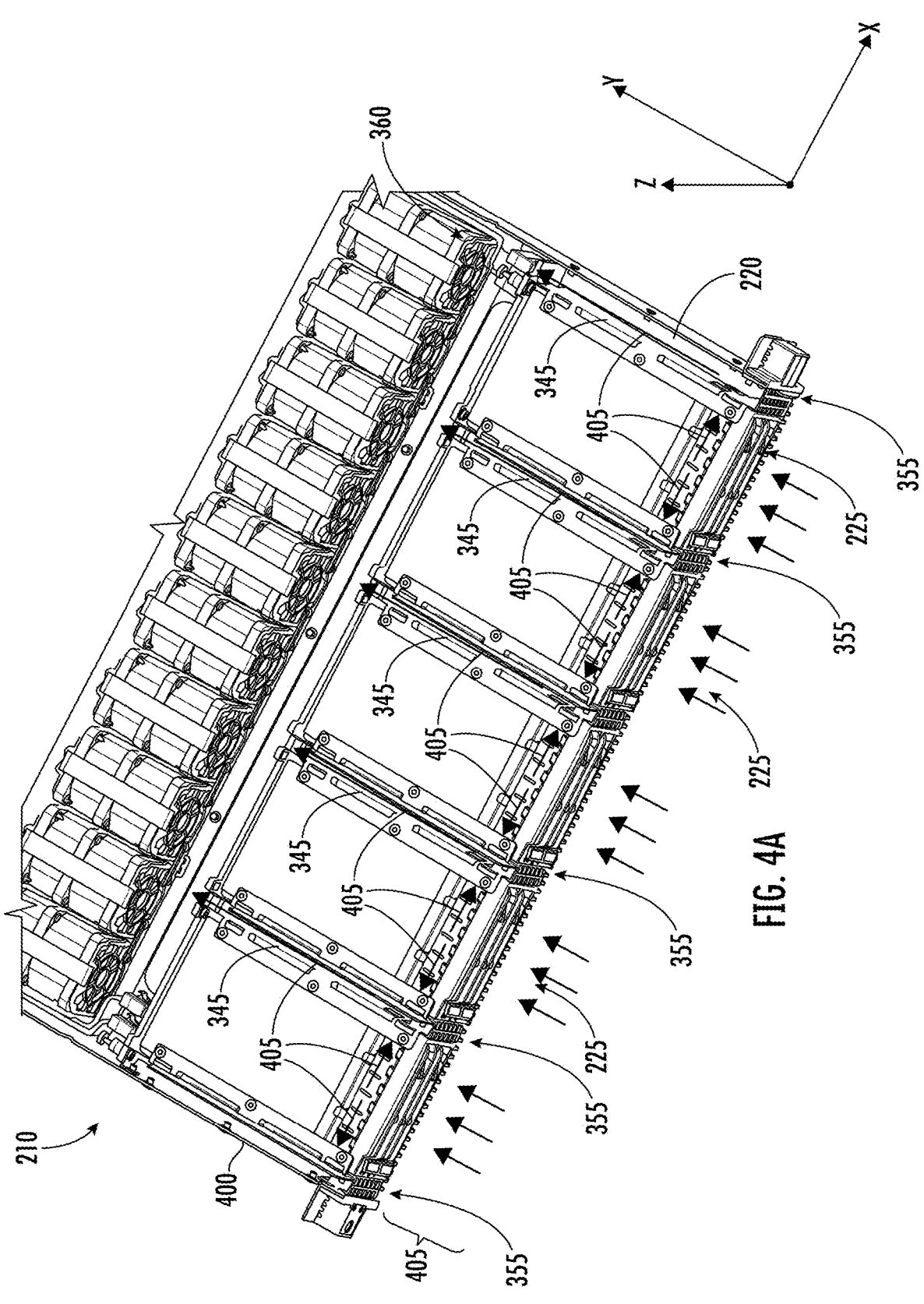
FIG. 4A illustrates an electronic system including an electronic assembly array and a plurality of airflow bypass channels, in accordance with some implementations.

FIG. 4A illustrates an electronic system 210 including an electronic assembly array 215 and a plurality of airflow bypass channels 345, in accordance with some implementations. As described above in reference to FIG. 2, the electronic assembly array 215 is one or more electronic assemblies 220 received by a plurality of device bays 330 (FIG. 3) of the electronic system 210.

Figure 4B:
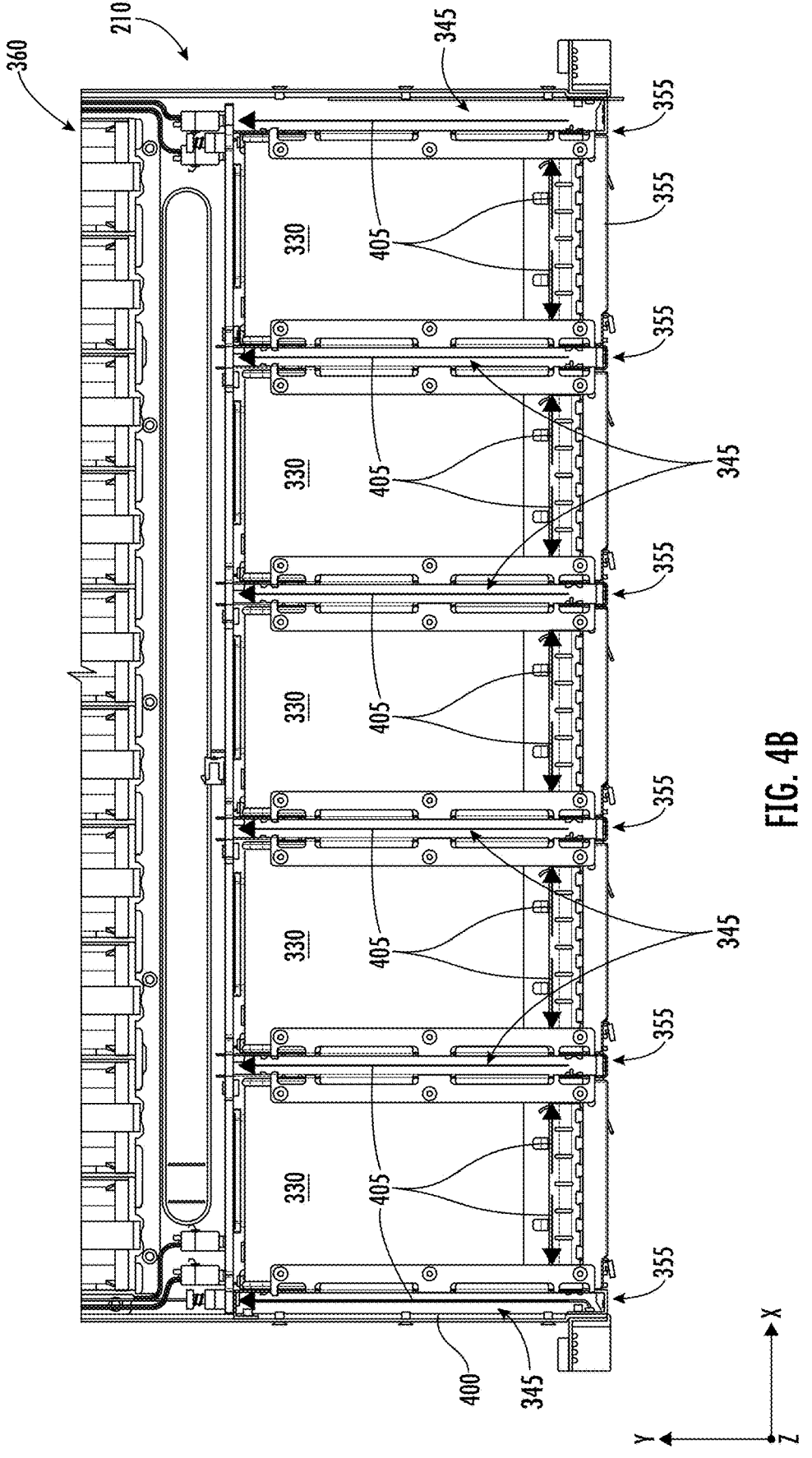
FIG. 4B shows airflow through the electronic system, in accordance with some implementations.

FIGS. 4A and 4B show airflow 405 through the electronic system 210, in accordance with some implementations. In some implementations, the electronic assembly 220 is configured to direct the air received by a front opening 355 of the electronic assembly 220 to flow across a top surface and a bottom surface of the storage module concurrently with directing the air to adjacent airflow bypass channels of the plurality of airflow bypass channels 345. For example, the electronic assembly 220 is configured to direct the air received by a front opening 355 to second bypass channels 345 and third bypass channels 345 as well as the top and bottom of the respective airflow channels of the device bay 330 (as shown in FIG. 4C).

Figure 4C:
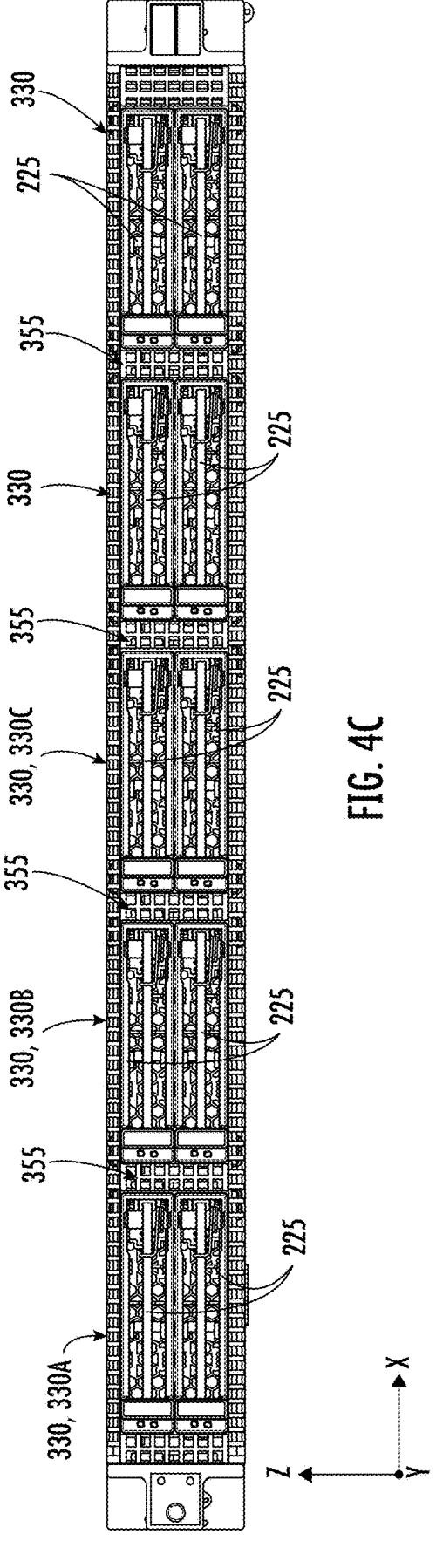
FIG. 4C illustrates a front view of the electronic system including the electronic assembly array and the plurality of airflow bypass channels, in accordance with some implementations.

FIG. 4C illustrates a front view of the electronic system including the electronic assembly array and the plurality of airflow bypass channels, in accordance with some implementations. In some implementations, each device bay of the plurality of device bays 330 is configured to accommodate at least two electronic assemblies 220 in the same device bay 330. For example, in some implementations, a first device bay 330A is configured to mechanically support a first and second electronic assembly 220 and 220B and their respective electronic modules 225 via its divider walls 310 (FIG. 3). In some implementations, the first electronic assembly 220 is disposed below the second electronic assembly 220B within the first device bay 330. In some implementations, each adjacent device bay 330 can accommodate at least two electronic assemblies 220.

As described above in reference to FIG. 4B, the plurality of airflow bypass channels 345 are located between the adjacent electronic assembly 220 (e.g., between device bays of the plurality of device bays 330 described above in reference to FIG. 3A). Additionally, in some implementations, the plurality of airflow bypass channels 345 are located at the corners of the electronic system 210 and the top and bottom of the electronic assembly array 215 (e.g., along the outer edges of the front surface of the electronic system 210 in FIG. 2).

Figure 4D:
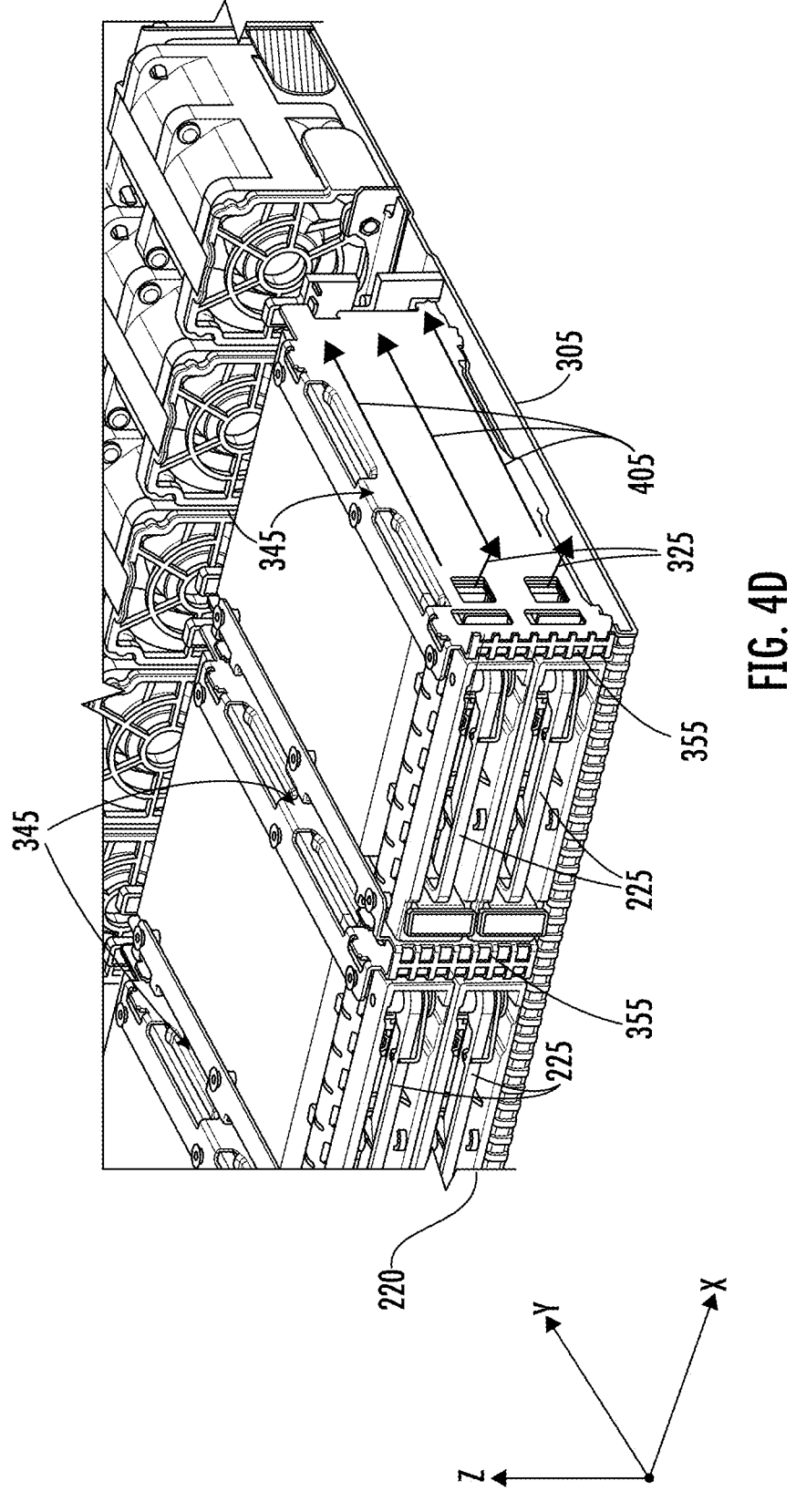
FIG. 4D shows airflow through a corner of the electronic system, in accordance with some implementations.

FIG. 4D shows airflow through a corner of the electronic system, in accordance with some implementations. As described above in reference to FIG. 4B, the electronic assembly 220 is configured to direct the air received by a front opening 355. In some implementations, the electronic assembly 220 received at a bay opening 335 (FIG. 3A) of the electronic system 210 is configured to direct the flow of air to airflow bypass channels 345 adjacent to the device bay 330. As described above in reference to FIG. 3A, the electronic system 210 has a plurality of divider walls 310, and each divider wall 310 includes at least one divider opening 325 that is configured to direct air received from the front opening 355 to a respective airflow bypass channel 345 of the plurality of airflow bypass channels 345. For example, the electronic assemblies 220 received by the fifth device bay 330E are configured to direct the air received via the front opening 355 towards respective divider openings 325 of each device wall adjacent to the fifth device bay 330E and into respective airflow bypass channels 345 (e.g., a fourth bypass channel 345D between adjacent device bays 330C, 330D, and a fifth bypass channels 345E at a corner of the electronic system 210).

Figures 5A, 5B:
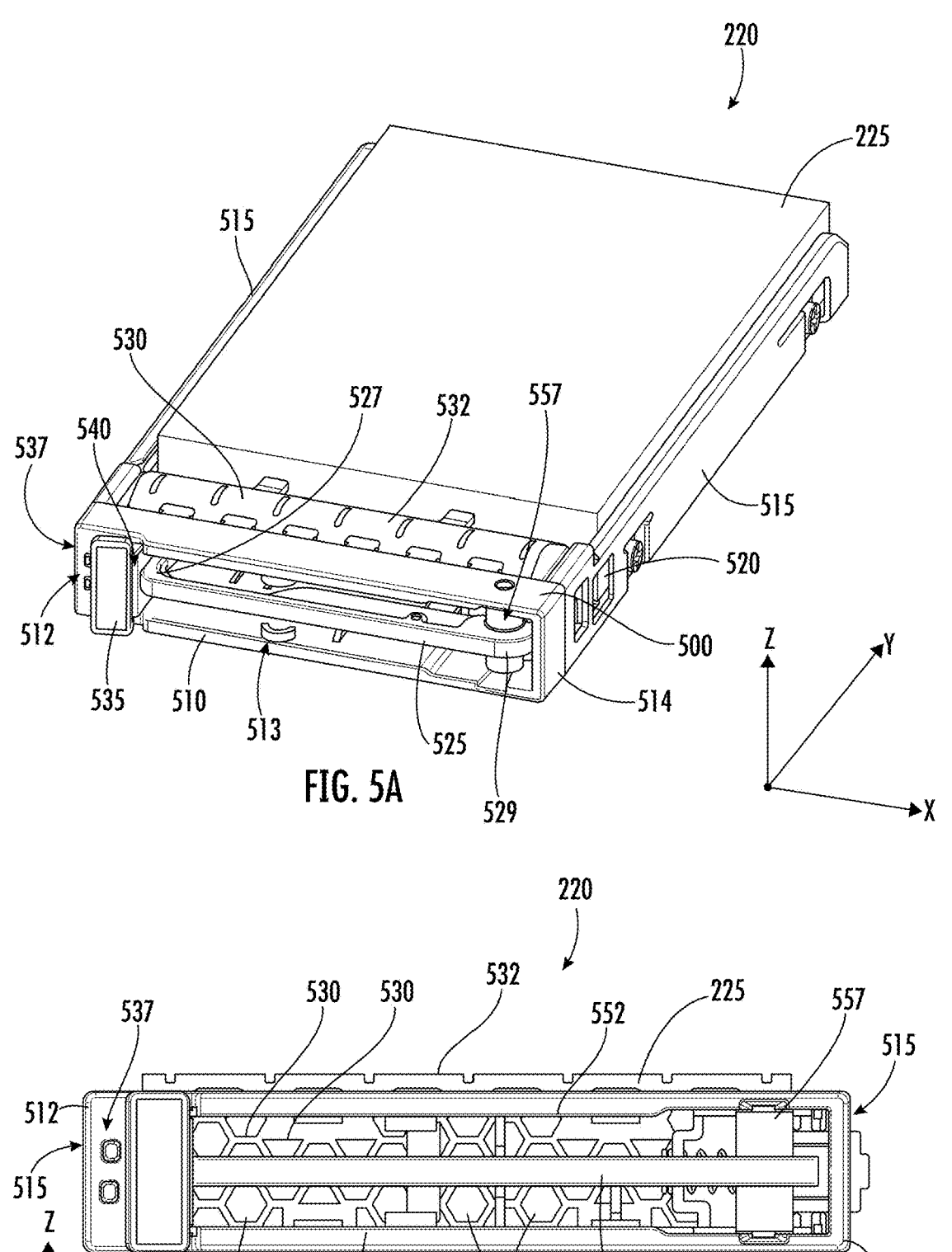
FIGS. 5A-5E illustrate different views of an electronic assembly, in accordance with some implementations.

FIGS. 5A-5E illustrate different views of an electronic assembly 220, in accordance with some implementations. FIG. 5A shows a perspective view of the electronic assembly 220. In some implementations, the electronic assembly 220 includes an open frame structure 500 having a front frame 510 including a front opening 513 configured to receive air, two side rails 515 coupled to two opposite sides of the front frame 510. In some implementations, the open frame structure 500 (e.g., the front frame 510 and the two side rails 515) is formed of a single piece or a collection of pieces. In some implementations, a lever bar 525 is coupled in proximity to the two opposite sides of the front frame 510. In some implementations, a first side 512 of the two opposite sides of the front frame 510 is coupled to a trigger mechanism 535. In some implementations, the electronic assembly 220 includes an electromagnetic (EM) shield 530. In this example, the EM shield 530 is patterned with openings to allow for air flow through the EM shield 530. Each of the components of the electronic assembly 220 are discussed in detail below.

Each side rail 515 of the two side rails 515 includes a side opening 520 and an extended portion. In some implementations, the side opening 520 is configured to direct the air received by the front opening 513 at least partially out of the open frame structure 500 and towards respective divider openings 325 of one or more divider walls 310 (sec FIGS. 3A-3C). Additional information on the flow of the air is provided below. The extended portion extends from the side opening 520 and away from the front frame 510. The extended portion is configured to hold one or more electronic modules 225 (e.g., a storage module). The side rails 515 are configured to be received and/or supported by respective divider walls 310 of a device bay 330 as described above in reference to FIG. 3A.

The lever bar 525 has at least a lock position and a release position. The lever bar 525, when in the lock position, is configured to lock, via a latch 540 on the electronic assembly 220, the electronic assembly 220 and the electronic module 225 onto a chassis base 305 (FIG. 3A) of the electronic system 210 (FIG. 2). In some implementations, the latch 540 is formed of sheet metal. When the lever bar 525 is in the release position, the lever bar 525 is configured to release the electronic assembly 220 and the electronic module 225 from the chassis base 305 of the electronic system 210 such that the electronic assembly 220 and the electronic module 225 are removable from the electronic system 210. The lever bar 525 provides a user grip point when released for removal of the electronic assembly 220 and the electronic module 225. The lever bar 525 does not have a free end and is not used to provide insertion or removal forces for the individual electronic modules 225. In other words, while the lever bar 525 is in the released position, a first end 527 of the lever bar 525 remains coupled in proximity to the first side 512 of the front frame 510 of the electronic assembly 220 and a second end 529 of the lever bar 525 remains coupled in proximity to the second side 514 of the front frame 510 of the electronic assembly 220, which allows the lever bar 525 to be used to handle (e.g., push, pull, lift, or otherwise carry) the electronic assembly 220 without applying a force to remove the electronic module 225 from the electronic assembly 220. Additionally, when the lever bar 525 is moved from the release position to the lock position, the lever bar 525 does not apply a force to attach or couple the electronic module 225 to the electronic assembly 220. By remaining coupled in proximity to the first side 512 and the second end 514 of the front frame 510 of the electronic assembly 220, the lever bar 525 has limited movement between the lock and release position. Additional information on the lock position and the release position is provided below in reference to FIGS. 7A-1-7C-2.

In some implementations, the trigger mechanism 535 is positioned at the first side 512 of the two opposite sides of the front frame 510 to reduce airflow impedance. In some implementations, the trigger mechanism 535 is configured to release the first end 527 of the lever bar 525 from the lock position. While the first end 527 of the lever bar 525 is released, the second end 529 of the lever bar 525 in proximity to a second side 514 of the two opposite sides of the front frame 510 is configured to pivot (e.g., rotate about a pivot point 557; see also FIG. 5B). In some implementations, the trigger mechanism 535 includes dynamic indicators 537 that identify one or more points of failure, if any. Non-limiting examples of the points of failure include detected faults within the one or more electronic modules 225, improper coupling of the electronic assembly 220 and the electronic system 210, and improper coupling of one or more electronic modules 225 and respective electronic connectors that are disposed through the openings 340 (FIG. 2). Alternatively or in addition, in some implementations, the dynamic indicators 537 identify that no errors are detectable (e.g., the electronic assembly 220 and the electronic system 210 are coupled properly, the one or more electronic modules 225 and respective electronic connectors extending through the openings 340 are coupled properly, and/or no faults on the one or more electronic modules 225 is detected). In some implementations, the dynamic indicators 537 can be illuminators (e.g., light emitting diodes (LEDs) that are displayed in different colors (e.g., green, yellow, red, etc.) and/or are illuminated with different patterns (e.g., steady illumination, rapid blinking, etc.) to provide a user with an easy interpretation of a detected points of failure or lack thereof.

In some implementations, the EM shield 530 includes a plurality of EM spring finger shields 532 extending from the EM shield 530 and towards the front frame 510. In some implementations, the plurality of EM spring finger shields 532 are coupled to a portion of the front frame 510 securing the EM shield 530 to the front frame 510. In some implementations, the EM shield 530 is an EM shielding sheet enclosing a hollow space 565 with the front frame 510 and the two side rails 515 (FIG. 5B).

FIG. 5B shows a front view of the electronic assembly 220. The front frame 510 is configured to provide a large open area to reduce impedance for airflow. In some implementations, the EM shield 530 is coupled to the two side rails 515 and has a plurality of opening holes 534. In some implementations, the plurality of opening holes 534 of the EM shield 530 has a total hole area that exceeds a threshold portion of an area of the front opening of the front frame 510. For example, in some implementations, the total hole area of the opening holes 534 exceeds at least 80% of an area of the front opening of the front frame 510. In some implementations, one or more holes of the plurality of opening holes 534 have a hexagonal shape. In some implementations, the EM shield 530 is configured to form a bypass gap 575 (FIG. 5E) with the electronic module 225 held by the extended portion of each side rail 515. In some implementations, the EM shield 530 includes a plurality of EM spring finger shields 532 enclosing the hollow space 565 from a top side 552 and a bottom side 554 of the hollow space 565. In some implementations, the plurality of EM spring finger shields 532 are stamped Beryllium-Copper (Be—Cu).

The lever bar 525 has a cross section 555 facing the front opening 513 of the front frame 510. In some implementations, the cross section 555 of the lever bar 525 has a cross sectional area that is less than a threshold portion of an area of the front opening 513 of the front frame 510. For example, in some implementations, the cross section of the lever bar 525 is less than 20% of the area of the front opening 513 of the front frame 510. In this way, the lever bar 525 adds little air flow impedance. In some implementations, a width of the lever bar 525 is a substantially narrow. For example, in some implementations, the lever bar 525 has a width that is at least less than 10% of a size of the two opposite sides of the front frame 510. The narrow width of the lever bar 525 is configured to further reduce the air flow impedance. In some implementations, dimensions of the lever bar 525 facing the airflow is substantially controlled such that a height and depth of the lever bar 525 reduce the airflow by less than 20% compared with an open air channel (i.e., without the lever bar 525). In some implementations, the lever bar 525 is located at the center of the front frame 510 (e.g., at the center of the first side 512 and the second side 514).

Figure 5C:
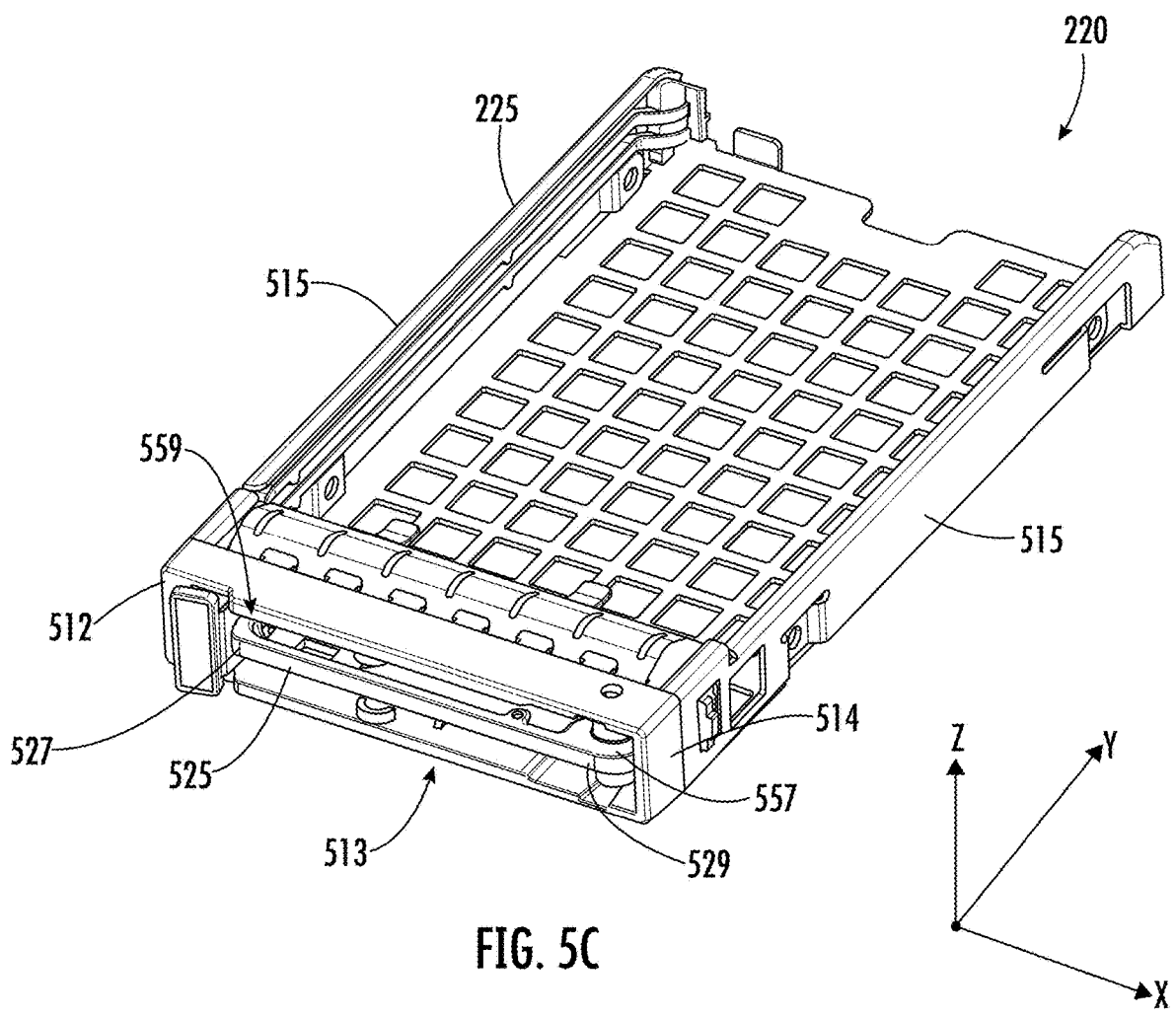

FIG. 5C shows a perspective view of the electronic assembly 220, in accordance with some implementations. The electronic assembly 220 illustrates a pivot point 557 of the lever bar 525 and a pin structure 559. In some implementations, the pivot point 557 is located at the second end 529 of the lever bar 525. The lever bar 525 is configured to pivot around the second end 529 to move between the lock position and the release position as discussed below. In some embodiments, the pin structure 559 is located at the first end 527 of the lever bar 525. The pin structure 559 is configured to prevent the first end 527 of the lever bar 525 from being removed from the electronic assembly 220 when the lever bar 525 is in the release position as described below.

Figure 5D:
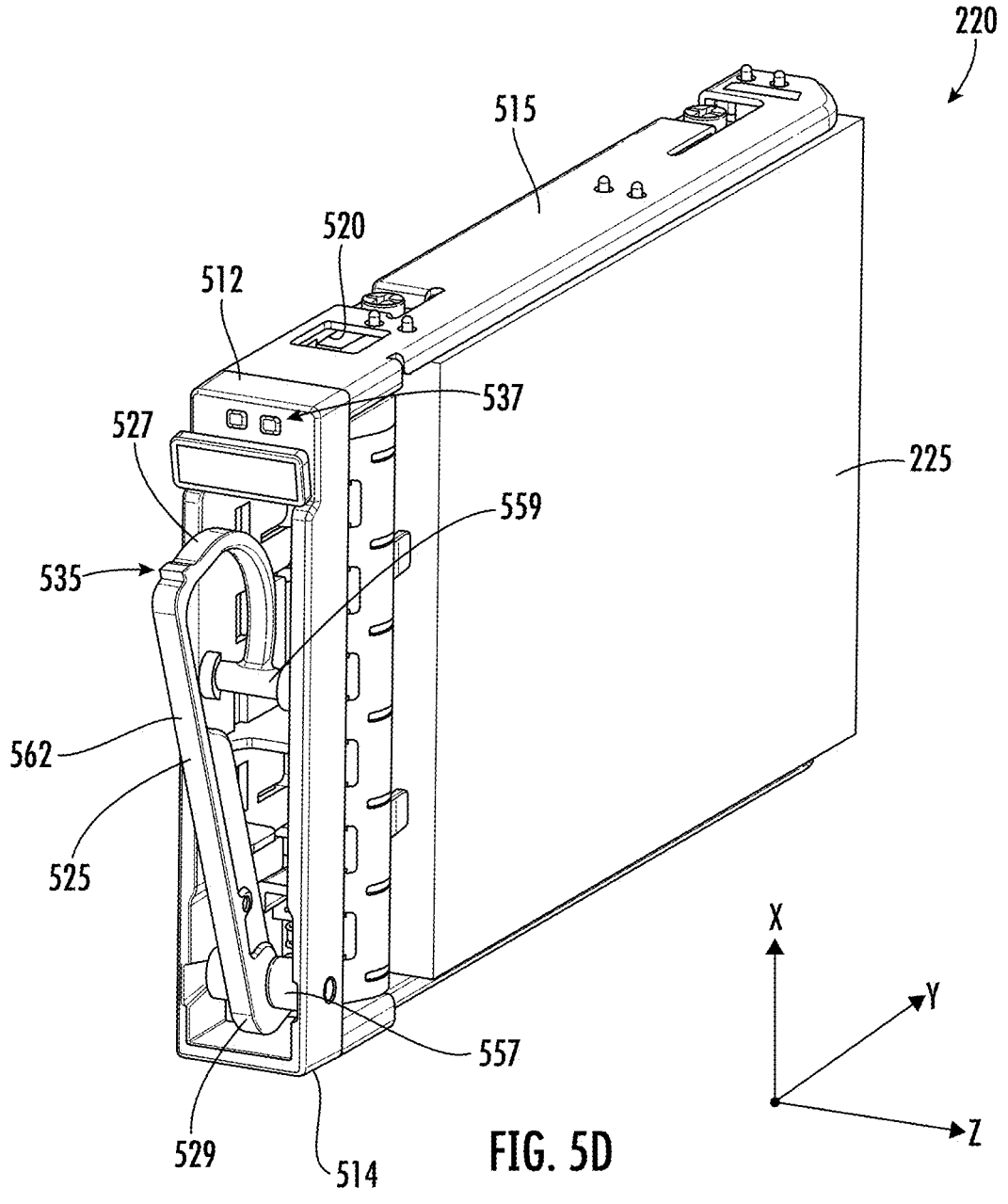

FIG. 5D illustrates a release position view of the electronic assembly 220. In particular, the release position view shows the lever bar 525 of the electronic assembly 220 pivoted around the second end 529 into the release position. As described above in reference to FIG. 5A, the trigger mechanism 535 is used to release the lever bar 525 from the lock position. Once released from the lock position, the lever bar 525 is adjustable (around the pivot point 557) between the lock position and the release position. For example, the first end 527 of the lever bar 525 is configured to move outwards (e.g., away from the front frame 510 of the electronic assembly 220, as shown in FIG. 5D) while the second end 529 of the lever bar 525 rotates around the pivot point 557 in at a fixed position of the electronic assembly 220. The first end 527 of the lever bar 525 remains coupled in proximity to the first side 512 of the front frame 510 via pin structure 559. In particular, pin structure 559 limits the movement of the first end 527 of the lever bar 525 such that the lever bar 525 is not released from the electronic assembly 220. In this way, the lever bar 525 does not have a free end as described above in reference to FIG. 5A. Further, the lever bar 525 provides a user grip point (e.g., midpoint 562 of the lever bar 525) when released. More specifically, the lever bar 525 remains affixed to the electronic assembly 220 and is used to hold the electronic assembly 220 and/or apply forces to the electronic assembly 220. In some implementations, the lever bar 525, when in the release position, allows for the electronic assembly 220 to be removed or inserted into the electronic system 210. The lever bar 525 is not used to insert or remove individual electronic modules 225 to the electronic assembly 220.

Figure 5E:
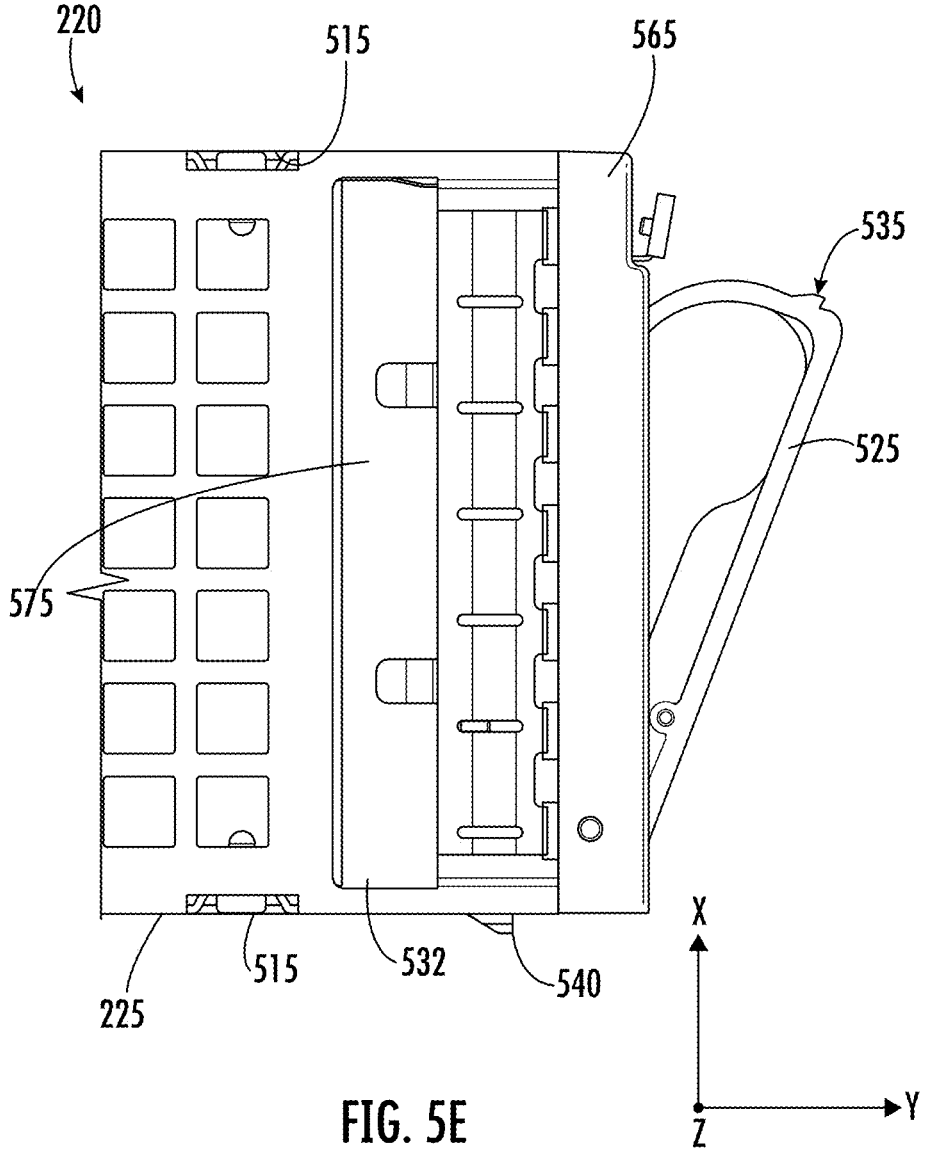

FIG. 5E illustrates airflow of the electronic assembly 220, in accordance with some implementations. In some implementations, the electronic assembly 220 is configured to direct the air received by the front opening of the front frame 510 to flow across a top surface and a bottom surface of the electronic module 225 concurrently with directing the air to the side opening 520 (FIG. 5D) of each side rail 515. In some implementations, the air directed to the side opening 520 of each side rail 515 is further directed towards a divider opening 325 (FIG. 3A) to a respective airflow bypass channel of the plurality of airflow bypass channels 345. In some implementations, the air received by the front frame 510 is configured to enter the hollow space 565 and exit the hollow space 565 via the plurality of opening holes 534 of the EM shield 530. The air that exits the hollow space 565 hits an electronic module 225, flows in the bypass gap 575, and exits the bypass gap 575 via the side opening 520 of each side rail 515, thereby dissipating heat generated by the electronic module 225 out of the electronic assembly 220 and providing additional airflow to other components of the electronic system 210 (described above in reference to FIG. 1). In some implementations, the bypass gap 575 between the electronic module 225 and the hollow space 565 of the front frame 510 allows air to flow around the electronic module 225 and into the side opening 520 of each side rail 515 to reduce impedance for airflow through the electronic assembly 220 to cool the devices or components located downstream in the electronic system 210. Additional examples of the airflow within the electronic system 210 are shown and described above in reference to FIGS. 4B and 4D.

Figure 6:
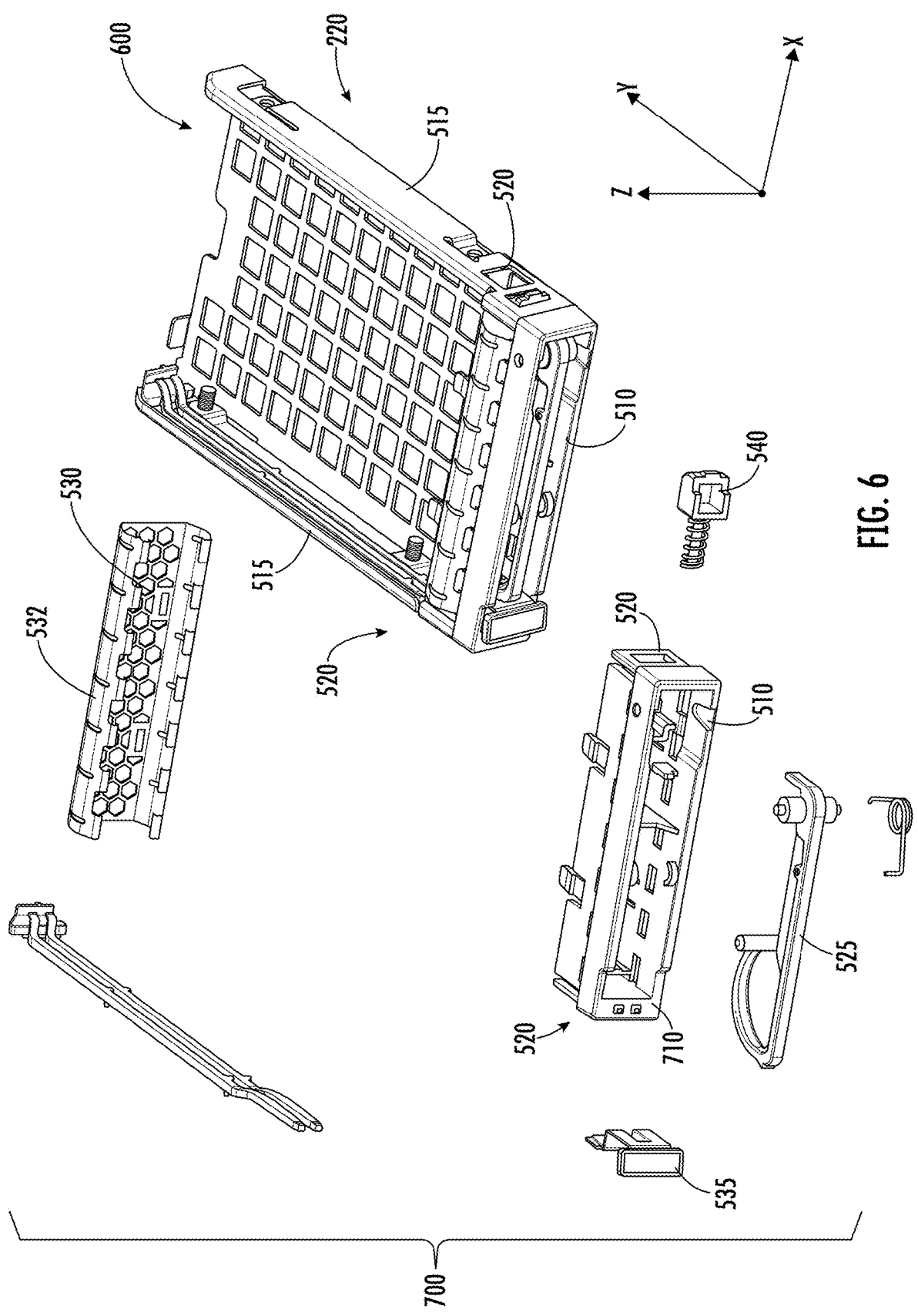
FIG. 6 illustrates an exploded view of the electronic assembly, in accordance with some implementations.

FIG. 6 illustrates a bracket assembly 600 of the electronic assembly 220 of FIGS. 5A-5E (i.e., the electronic assembly 220 in which no electronic modules 225 are mounted), in accordance with some implementations. As described above in reference to FIGS. 5A-5E, the bracket assembly 600 of the electronic assembly 220 includes an open frame structure having a front frame 510. The two side rails 515 are configured to be coupled to the front frame 510 to provide the front rails 515 on two opposite sides of the front frame 510 when installed, and are extending away from the front frame 510. The front frame 510 includes two, opposite side openings 520. The lever bar 525 is configured to be coupled in the front frame 510 in proximity to the two opposite sides of the front frame 510 to be able to open and close about the front frame 510 as previous described. In some implementations, the extended portion of the two side rails 515 are configured to hold one or more electronic modules 225.

The open frame structure of the electronic assembly 220 and the one or more electronic modules 225 (coupled to the open frame structure) are configured to be mechanically supported by a plurality of divider walls 310 of a chassis base 305 of an electronic system 210 as described above in reference to FIG. 3. In particular, as shown in FIG. 3, the chassis base 305 has a plurality of divider walls 310 that define a plurality of device bays 330, and each device bay 330 includes a respective bay opening 335 that is configured to receive one or more open frame structures (i.e., one or more electronic assemblies 220). Each divider wall 310 includes at least one divider opening 325 in proximity to the bay opening 335 of the device bay 330. The open frame structure, when received by a bay opening 335 of a device bay 330 and when mechanically supported by a plurality of divider walls 310, is configured such that the side openings 520 of the two side rails 515 align with the divider opening 325 of respective divider walls 310. In this way, the side openings 520 of the two side rails 515 direct air towards the divider openings 325 of respective divider walls 310 (exiting the side openings 520) to respective airflow bypass channels 345. The respective airflow bypass channels 345 are configured to direct the air away from the bay opening 335 of the device bay 330.

FIG. 6 also illustrates an exploded view 700 of the electronic assembly, in accordance with some implementations. In particular, exploded view 700 shows a front bezel 710 of the front frame 510, a front rail 515, the lever bar 525, the trigger mechanism 535, the EM shield 530, and the latch 540. In some implementations, the front frame 510 is an open structure formed of a single piece or a collection of pieces. In some implementations, the front frame 510 is configured to couple to the side rails 515. In some implementations, the front bezel 710 provides a cover for the side rails 515. In some implementations, the front frame 510 and the side rails 515 are formed of sheet metal.

In some implementations, the lever bar 525 is die cast. In some implementations, the lever bar 525 is formed of sheet metal or plastic. The lever bar 525 includes grip features using a spring pin and torsion springs (not shown). More specifically, when the lever bar is in the release position, it moves away from the front frame 510 to allow the user to grip the lever bar 525. In some implementations, when the lever bar 525 is released, the lever bar pulls the latch 540 inward to release the electronic assembly 220 from a chassis base (FIG. 3A). As described above in reference to FIGS. 5A-5E, in some implementations, the trigger mechanism 535 includes dynamic indicators. In some implementations, a poly optic fiber is used to enable flexible indicators that can move with the trigger mechanism 535.

Figures 2, 7A:
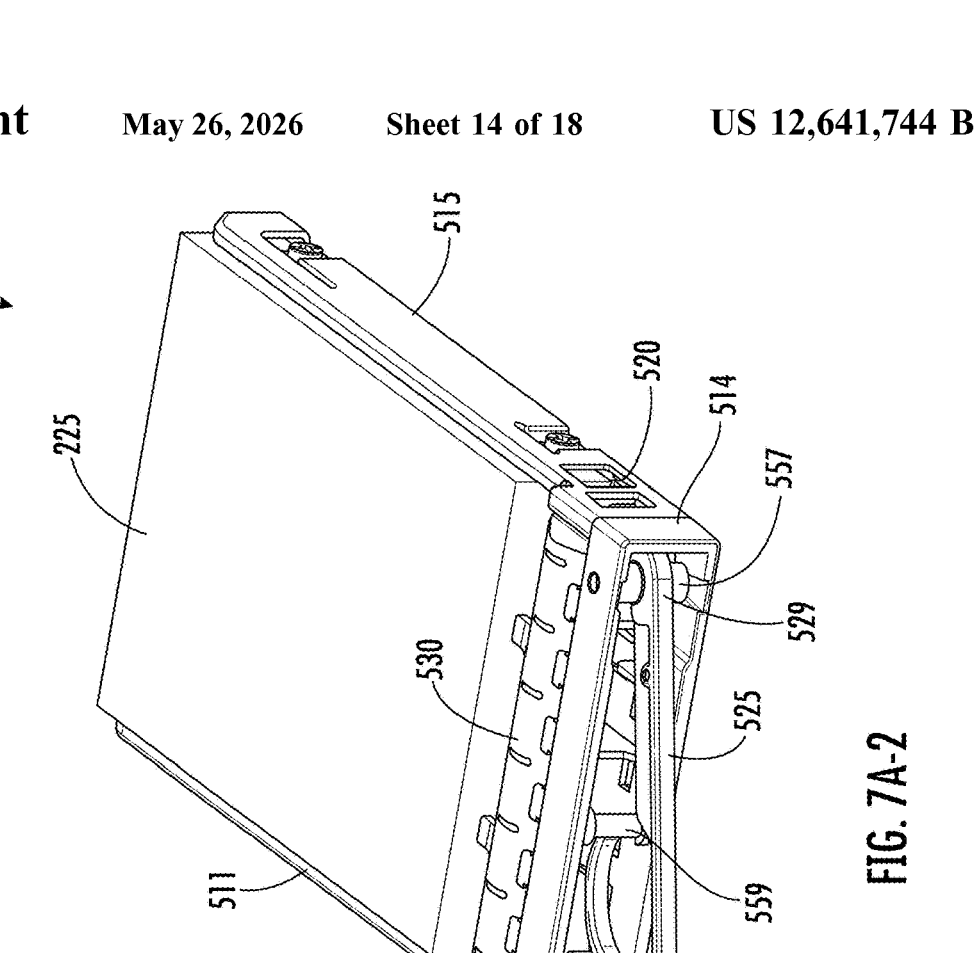
Figures 1, 7A:
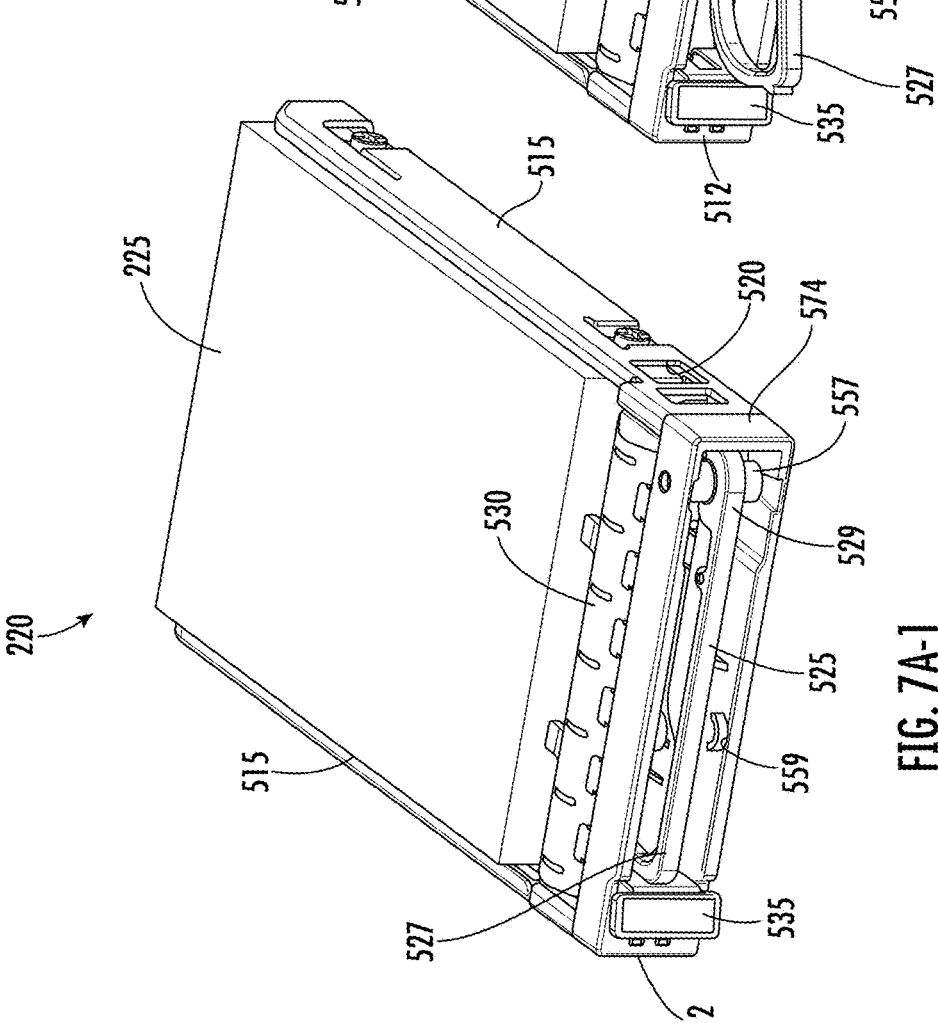
Figures 2, 7B:
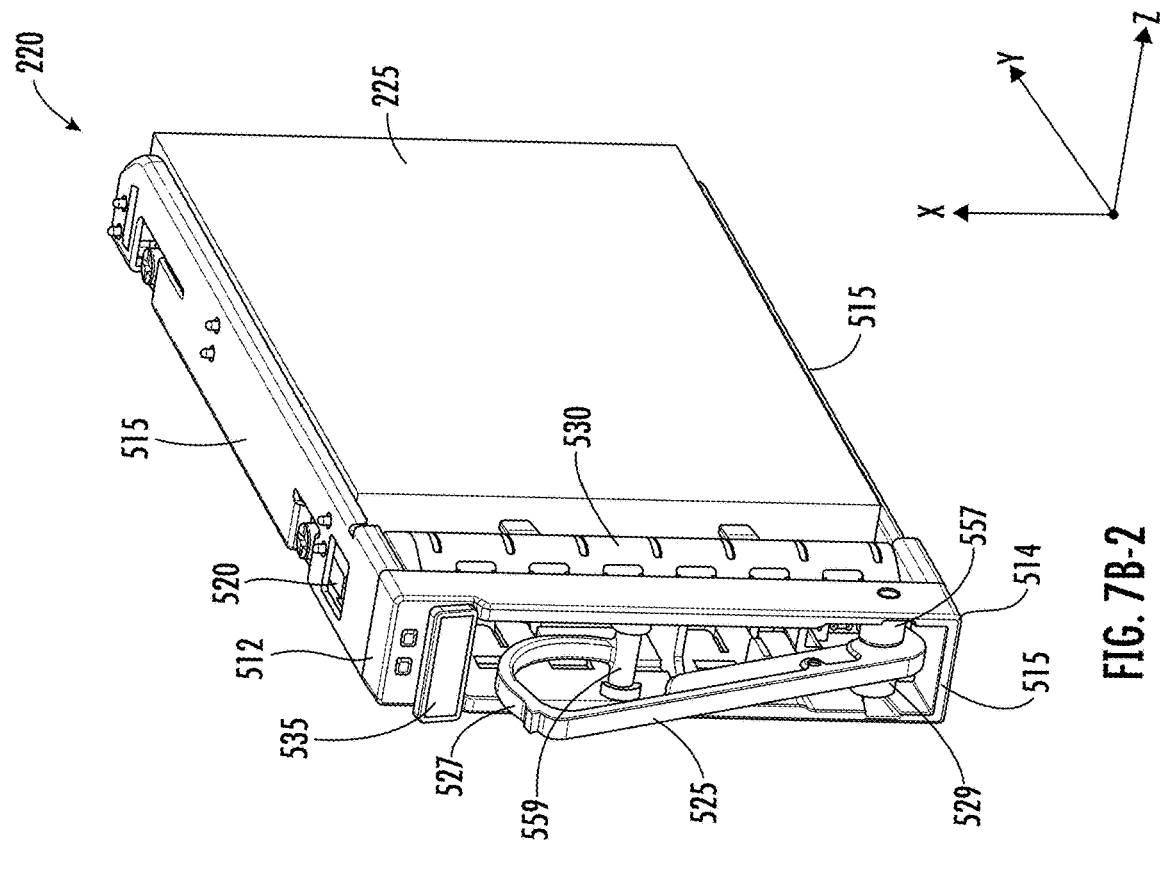
Figures 1, 7B:
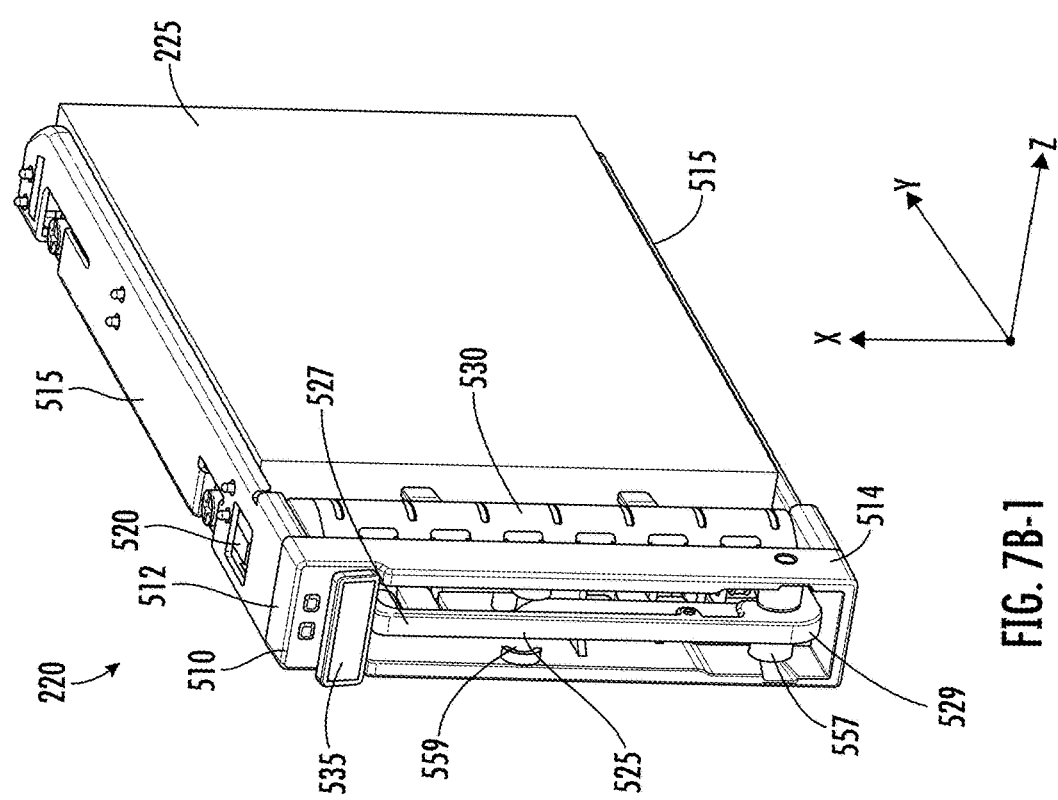
Figures 1, 2, 7C:
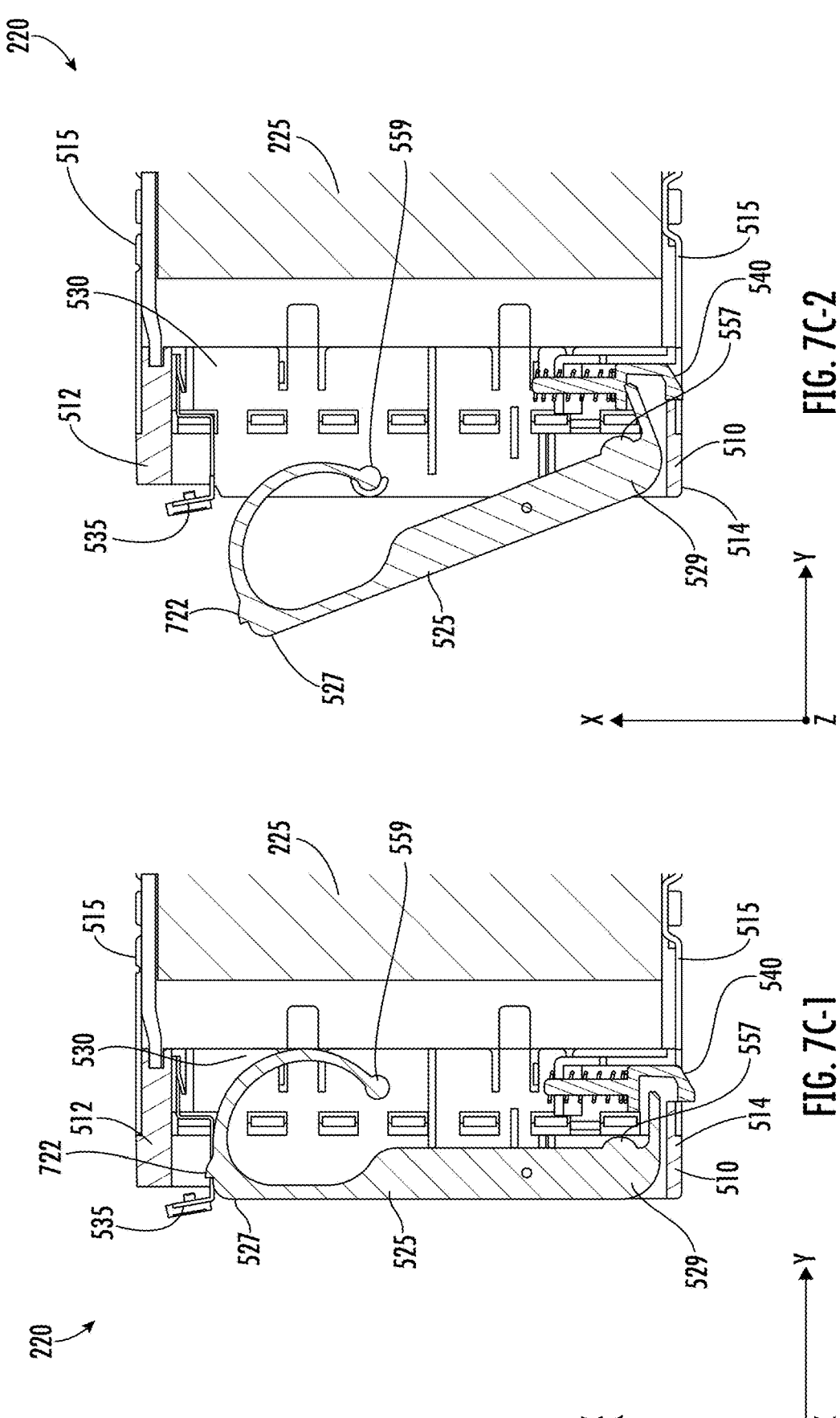

FIGS. 7A-1-7C-2 illustrates different views and different positions of the lever bar 525 of the electronic assembly 220, in accordance with some implementations. FIGS. 7A-1 and 7A-2 illustrate perspective side views of the lever bar 525 in a closed and open position about the electronic module 225. FIGS. 7B-1 and 7B-2 illustrate perspective top views of the lever bar 525 in a closed and open position, respectively, about the electronic module 225. FIGS. 7C-1 and 7C-2 illustrate top cross-sectional views of the lever bar 525 in a closed and open position, respectively, about the electronic module 225.

As described above in reference to FIGS. 5A-5E and as shown in FIGS. 7A-1-7C-2, a first side 512 of the two opposite sides of a front frame 510 is coupled to a trigger mechanism 535 that is configured to release a first end 527 of the lever bar 525 from a lock position. A second end 529 of the lever bar 525 is pivoted in proximity to a second side 514 of the two opposite sides of the front frame 510. In some implementations, the lever bar 525 is coupled to a spring structure, such that in response to a user action on the trigger mechanism 535, the lever bar 525 that is held at the lock position is configured to pivot around the second end 529 (e.g., around pivot point 557) and release the first end 527 to be loosely retained by the trigger mechanism 535. In some implementations, in the release position, part of the lever bar 525 stands out of the front opening of the front frame 510 to facilitate handling of the electronic assembly 220 (FIG. 2). For example, FIGS. 7A-1, 7B-1, and 7C-1 of the electronic assembly 220 shows the lever bar 525 in the lock position. FIGS. 7A-2, 7B-2, and 7C-2 of the electronic assembly 220 shows the lever bar 525 in the release position.

FIG. 7C-1 shows a top view of the lever bar 525 in the lock position. As shown therein, the first end 527 of the lever bar 525 is coupled to a portion of the trigger mechanism 535.

In particular, the trigger mechanism 535 includes a retention latch or a retention bar 722 that couples to the first end 527 of the lever bar 525 such that the lever bar 525 is held firmly in place. While in the lock position, the second end 529 of the lever bar 525 does not interact with the latch 540. The latch 540 couples the electronic assembly 220 to a device bay 330 and/or a divider wall 310 of a chassis base 305 (FIG. 3).

FIG. 7C-2 shows a top view of the lever bar 525 in the release position. As shown therein, the first end 527 of the lever bar 525 is no longer coupled to the portion of the trigger mechanism 535. In some implementations, the trigger mechanism 535 is actuated (e.g., pressed downward towards the side 512 of the front frame 510) to release the first end 527 of the lever bar 525. In some implementations, the retention latch 722 of the trigger mechanism 535 is a linear metal bar down the center of the opening in the front frame 510. The lever bar 525 does not need to be aligned with the trigger mechanism 535. In other words, the lever bar 525 and the trigger mechanism 535 are positioned such that they are aligned and do not become unaligned when moved between the lock position and the release position.

Once the first end 527 of the lever bar 525 is no longer coupled to the retention latch 722 of the trigger mechanism 535, the second end 529 of the lever bar 525 is able to pivot around pivot point 557. While in the release position, the second end 529 of the lever bar 525 interacts with the latch 540 lifting the latch 540 (e.g., inwards towards the center of the front frame 510). The latch 540 when lifted allows the electronic assembly 220 to be removed from the device bay 330 and/or the divider wall 310 of the chassis base 305.

Figures 8A, 8B:
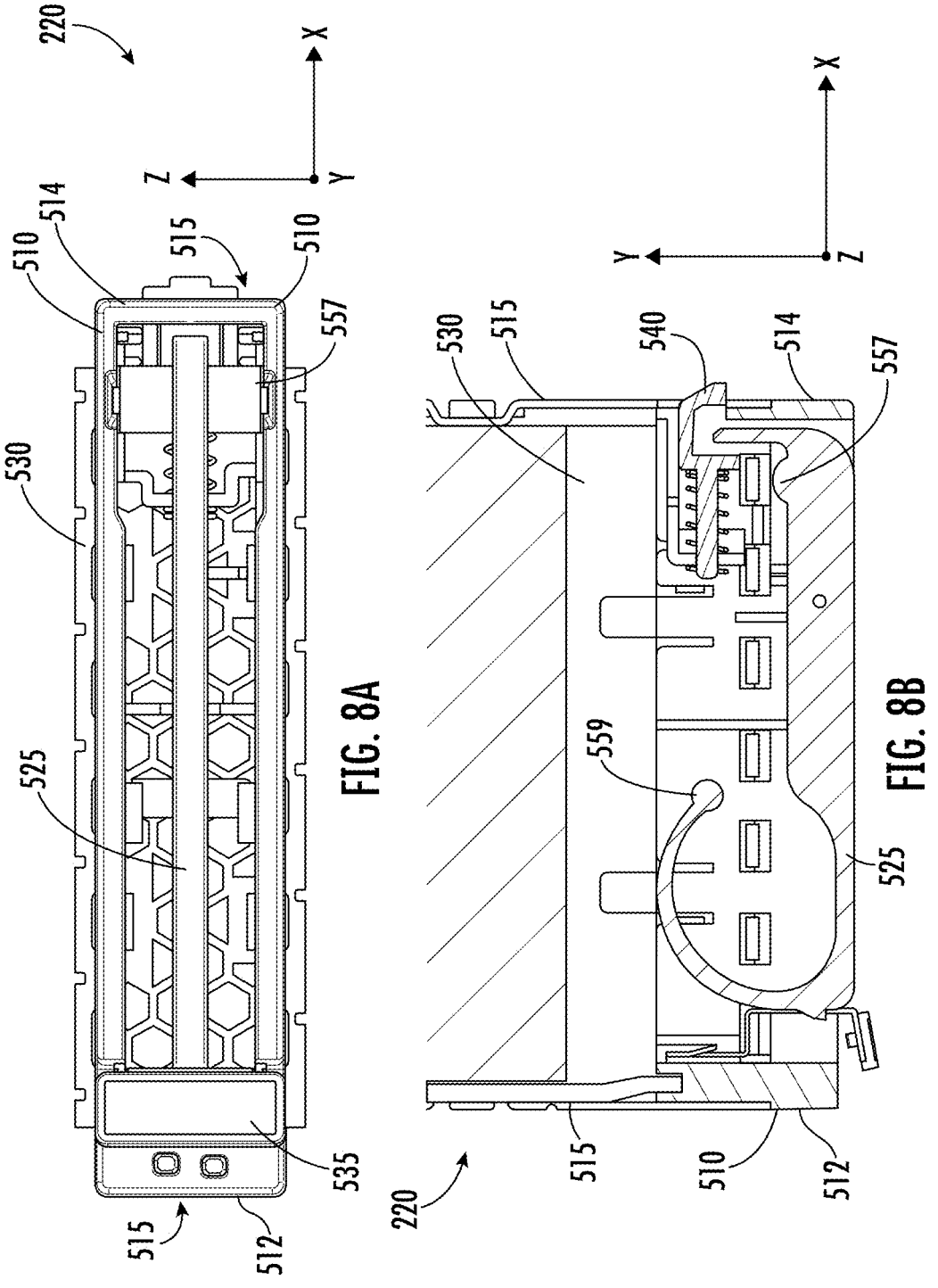
FIGS. 8A-8D provide additional views of the electronic assembly, in accordance with some implementations.
Figure 8C:
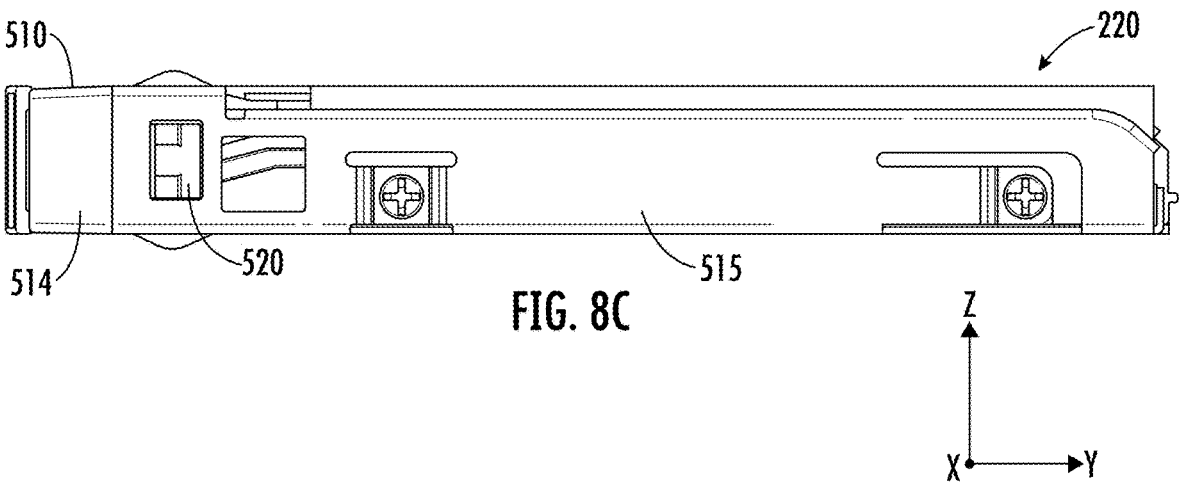
Figure 8D:
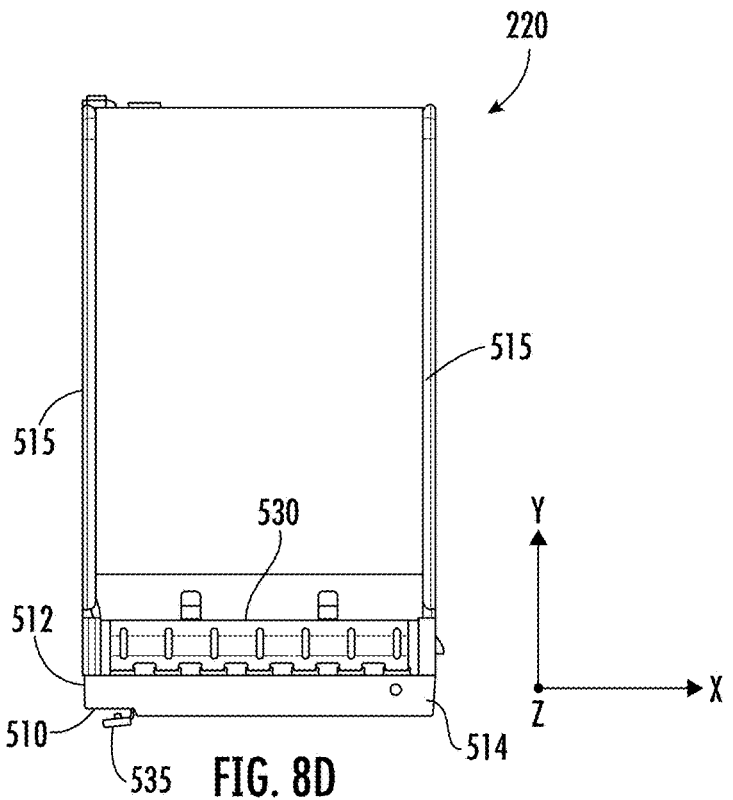

FIGS. 8A-8D provides additional views of the electronic assembly 220, in accordance with some implementations. In particular, FIG. 8A provides a front view of the electronic assembly 220 (FIG. 2), FIG. 8B provides a top view of the front frame 510 of the electronic assembly 220 including a lever bar 525. FIG. 8C provides a side view of the electronic assembly 220. FIG. 8D provides and a top view of the electronic assembly 220 including the directed airflow. Common element numbers are shown in FIGS. 8A-8D with previous discussion of the electronic assembly 220.

It will be understood that, although the terms "first," "second," etc. may be used herein to describe various elements, these elements should not be limited by these terms. These terms are only used to distinguish one element from another.

The terminology used herein is for the purpose of describing particular implementations only and is not intended to be limiting of the claims. As used in the description of the implementations and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" can be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" can be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

Implementation examples are described in the following numbered clauses:

1. An electronic system, comprising:
   a chassis base comprising a plurality of divider walls defining a plurality of device bays and a plurality of airflow bypass channels between adjacent divider walls of the plurality of divider walls, each device bay comprising a bay opening, the plurality of device bays alternating with the plurality of airflow bypass channels;
   wherein each divider wall has a divider opening in proximity to the bay opening of an immediately adjacent device bay.

2. The electronic system of clause 1, wherein each divider opening of each divider wall is configured to direct air received from the bay opening of the immediately adjacent device bay to a respective airflow bypass channel of the plurality of airflow bypass channels that is configured to direct the air away from the bay opening of the immediately adjacent device bay.

3. The electronic system of clause 2 or 3, further comprising a plurality of intake sections each coupled to an airflow bypass channel of the plurality of airflow bypass channels, each intake section of the plurality of intake sections disposed adjacent to the chassis base.

4. The electronic system of any of clauses 1-3, wherein each device bay of the plurality of device bays of the chassis base includes a back plate that opposes the bay opening and has one or more electronic connectors.

5. The electronic system of clause 4, wherein the back plate comprises a plurality of openings each coupled to a device bay of the plurality of device bays.

6. The electronic system of clause 5, wherein the plurality of openings are each configured to direct air away from a respective device bay of the plurality of device bays adjacent to the plurality of openings.

7. The electronic system of any of clauses 4-6, wherein the one or more electronic connectors are configured to electrically couple to one or more electronic assemblies received via the bay opening of the respective device bay of the plurality of device bays.

8. The electronic system of any of clauses 1-7, wherein each device bay of the plurality of device bays is configured to receive, via the bay opening, one or more electronic modules that are mechanically supported by the plurality of divider walls.

9. The electronic system of any of clauses 1-8, wherein each device bay of the plurality of device bays is configured to accommodate one or more electronic modules that are arranged on top of one another within the respective device bay.

10. The electronic system of any of clauses 1-9, further comprising at least one electronic module disposed in a bay opening of at least one device bay of the plurality of device bays.

11. An electronic assembly, comprising:

an open frame structure comprising:

a front frame including a front opening configured to receive air; and two side rails coupled to two opposite sides of the front frame, a side opening configured to direct the air received by the front opening at least partially out of the open frame structure; and a lever bar coupled in proximity to the two opposite sides of the front frame and having at least a lock position and a release position, wherein the electronic assembly is configured to lock a storage module onto a chassis base in the lock position and to release the storage module from the chassis base in the release position.

12. The electronic assembly of clause 11, wherein each side rail of the two side rails further comprises a side opening and an extended portion;

the extended portion extending from the side opening and away from the front frame, the extended portion configured to hold the storage module.

13. The electronic assembly of clause 12, further comprising:

an electromagnetic (EM) shielding sheet coupled to the two side rails and comprising a plurality of opening holes, the EM shielding sheet enclosing a hollow space with the front frame and the two side rails.

14. The electronic assembly of clause 13, wherein the EM shielding sheet is configured to form a bypass gap with the storage module held by the extended portion of each side rail of the two side rails.

15. The electronic assembly of clause 14, wherein the air received by the front frame is configured to enter the hollow space, exit the hollow space via the plurality of opening holes of the EM shielding sheet, hit the storage module, flow in the bypass gap, and exit the bypass gap via the side opening of each side frame, thereby dissipating heat generated by the storage module out of the electronic assembly.

16. The electronic assembly of any of clauses 13-15, wherein the plurality of opening holes of the EM shielding sheet have a total hole area that exceeds a threshold portion of an area of the front opening of the front frame.

17. The electronic assembly of any of clauses 13-16, further comprising:

a plurality of EM spring finger shields extending from the EM shielding sheet and towards the front frame, the plurality of EM spring finger shields enclosing the hollow space from a top side and a bottom side of the hollow space.

18. The electronic assembly of any of clauses 11-17, wherein:

a first side of two opposite sides of the front frame is coupled to a trigger mechanism that is configured to release a first end of the lever bar from the lock position;

a second end of the lever bar is pivoted in proximity to a second side of the two opposite sides of the front frame;

the lever bar is coupled to a spring structure, such that in response to a user action on the trigger mechanism, the lever bar that is held at the lock position is configured to pivot around the second end of the lever bar and release the first end of the lever bar to be loosely retained by the trigger mechanism; and in the release position, part of the lever bar stands out of the front opening of the front frame to facilitate handling of the electronic assembly.

19. The electronic assembly of any of clauses 11-18, wherein the lever bar has a cross section facing the front opening of the front frame, and the cross section of the lever bar has a cross sectional area that is less than a threshold portion of an area of the front opening of the front frame.

20. The electronic assembly of any of clauses 11-19, wherein the electronic assembly is configured to direct the air received by the front opening of the front frame to flow across a top surface and a bottom surface of the storage module concurrently with directing the air to the side opening of each side rail of the two side rails.

21. The electronic assembly of any of clauses 11-20, further comprising the chassis base comprising a plurality of divider walls defining a device bay and an airflow bypass channel, wherein:

the device bay has a bay opening and is configured to receive, via the bay opening, the open frame structure holding the storage module;

the open frame structure and storage module are mechanically supported by the plurality of divider walls of the chassis base; and each divider wall has a divider opening in proximity to the bay opening of the device bay, and the divider opening is configured to be aligned with the side opening of a corresponding side rail and to direct the air exiting the side opening to the respective airflow bypass channel that is configured to direct the air away from the bay opening of the device bay.

22. The electronic assembly of clause 21, the open frame structure and the storage module forming a first electronic module, the electronic assembly further comprising:

a second electronic module including a second open frame structure holding a second storage module, wherein the second electronic module is mechanically supported by the plurality of divider walls of the chassis base and disposed below the first electronic module within a same device bay of the plurality of device bays of the chassis base.

23. The electronic assembly of clause 21, wherein the open frame structure and the storage module form a first electronic module, the device bay including a first device bay, and the plurality of divider walls defines a second device bay that extends in parallel with the first device bay, the electronic assembly further comprising:

a second electronic module including a second open frame structure holding a second storage module, wherein the second electronic module is mechanically supported in the second device bay by the plurality of divider walls of the chassis base.

24. The electronic assembly of any of clauses 21-23, wherein the device bay of the chassis base includes a back plate that opposes the bay opening and has an electronic connector, and the electronic connector is configured to electrically couple to the storage module received via the bay opening of the device bay.

What is claimed is:

1. An electronic assembly, comprising: an open frame structure comprising: a front frame including a front opening configured to receive air; and two side rails coupled to two opposite sides of the front frame, each side rail of the two side rails comprising: a side opening configured to direct the air received by the front opening at least partially out of the open frame structure; and a lever bar coupled in proximity to the two opposite sides of the front frame and having at least a lock position and a release position, wherein the electronic assembly is configured to lock a storage module onto a chassis base in the lock position and to release the storage module from the chassis base in the release position; and each side rail of the two side rails further comprises a side opening and an extended portion; the extended portion extending from the side opening and away from the front frame, the extended portion configured to hold the storage module; and an electromagnetic (EM) shielding sheet coupled to the two side rails and comprising a plurality of opening holes, the EM shielding sheet enclosing a hollow space with the front frame and the two side rails; and the EM shielding sheet is configured to form a bypass gap with the storage module held by the extended portion of each side rail of the two side rails; and the air received by the front frame is configured to enter the hollow space, exit the hollow space via the plurality of opening holes of the EM shielding sheet, hit the storage module, flow in the bypass gap, and exit the bypass gap via the side opening of each side frame, thereby dissipating heat generated by the storage module out of the electronic assembly.

2. The electronic assembly of claim 1, wherein the plurality of opening holes of the EM shielding sheet have a total hole area that exceeds a threshold portion of an area of the front opening of the front frame.

3. The electronic assembly of claim 1, further comprising:
a plurality of EM spring finger shields extending from the EM shielding sheet and towards the front frame, the plurality of EM spring finger shields enclosing the hollow space from a top side and a bottom side of the hollow space.

4. The electronic assembly of claim 1, wherein:
a first side of two opposite sides of the front frame is coupled to a trigger mechanism that is configured to release a first end of the lever bar from the lock position;
a second end of the lever bar is pivoted in proximity to a second side of the two opposite sides of the front frame;
the lever bar is coupled to a spring structure, such that in response to a user action on the trigger mechanism, the lever bar that is held at the lock position is configured to pivot around the second end of the lever bar and release the first end of the lever bar to be loosely retained by the trigger mechanism; and
in the release position, part of the lever bar stands out of the front opening of the front frame to facilitate handling of the electronic assembly.

5. The electronic assembly of claim 1, wherein the lever bar has a cross section facing the front opening of the front frame, and the cross section of the lever bar has a cross sectional area that is less than a threshold portion of an area of the front opening of the front frame.

6. The electronic assembly of claim 1, wherein the electronic assembly is configured to direct the air received by the front opening of the front frame to flow across a top surface and a bottom surface of the storage module concurrently with directing the air to the side opening of each side rail of the two side rails.

7. The electronic assembly of claim 1, further comprising the chassis base comprising a plurality of divider walls defining a device bay and an airflow bypass channel, wherein:
the device bay has a bay opening and is configured to receive, via the bay opening, the open frame structure holding the storage module;
the open frame structure and storage module are mechanically supported by the plurality of divider walls of the chassis base; and
each divider wall has a divider opening in proximity to the bay opening of the device bay, and the divider opening is configured to be aligned with the side opening of a corresponding side rail and to direct the air exiting the side opening to the respective airflow bypass channel that is configured to direct the air away from the bay opening of the device bay.

8. The electronic assembly of claim 7, the open frame structure and the storage module forming a first electronic module, the electronic assembly further comprising:
a second electronic module including a second open frame structure holding a second storage module, wherein the second electronic module is mechanically supported by the plurality of divider walls of the chassis base and disposed below the first electronic module within a same device bay of the plurality of device bays of the chassis base.

9. The electronic assembly of claim 7, wherein the open frame structure and the storage module form a first electronic module, the device bay including a first device bay, and the plurality of divider walls defines a second device bay that extends in parallel with the first device bay, the electronic assembly further comprising:
a second electronic module including a second open frame structure holding a second storage module, wherein the second electronic module is mechanically supported in the second device bay by the plurality of divider walls of the chassis base.

10. The electronic assembly of claim 7, wherein the device bay of the chassis base includes a back plate that opposes the bay opening and has an electronic connector, and the electronic connector is configured to electrically couple to the storage module received via the bay opening of the device bay.

* * * * *